United States Patent
Ohashi et al.

(10) Patent No.: US 6,458,674 B1
(45) Date of Patent: *Oct. 1, 2002

(54) PROCESS FOR MANUFACTURING SEMICONDUCTOR INTEGRATED CIRCUIT DEVICE

(75) Inventors: Naofumi Ohashi, Hannou; Junji Noguchi; Toshinori Imai, both of Ome; Hizuru Yamaguchi, Akishima; Nobuo Owada, Ome; Kenji Hinode, Hachiouji; Yoshio Homma, Hinode-machi; Seiichi Kondo, Kokubunji, all of (JP)

(73) Assignee: Hitachi, Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 10/050,562

(22) Filed: Jan. 18, 2002

Related U.S. Application Data

(63) Continuation of application No. 09/356,707, filed on Jul. 20, 1999, now Pat. No. 6,376,345.

(30) Foreign Application Priority Data

Jul. 24, 1998 (JP) .......................................... 10-209857

(51) Int. Cl.[7] .................................................. M01L 21/38
(52) U.S. Cl. ...................... 438/542; 438/693; 438/694
(58) Field of Search ................................ 438/592, 693, 438/694, 835, 717, 586, 626

(56) References Cited

U.S. PATENT DOCUMENTS

| | | |
|---|---|---|
| 5,084,071 A | 1/1992 | Nenadic et al. |
| 5,139,571 A | 8/1992 | Deal et al. |
| 5,144,498 A | 9/1992 | Vincent |
| 5,340,370 A | 8/1994 | Cadien et al. |
| 5,480,748 A | 1/1996 | Bakeman, Jr. et al. |

(List continued on next page.)

FOREIGN PATENT DOCUMENTS

| | | |
|---|---|---|
| JP | 1-164039 | 6/1989 |
| JP | 2-257631 | 10/1990 |
| JP | 5-47735 | 2/1993 |
| JP | 6-188203 | 7/1994 |
| JP | 7-135192 | 5/1995 |
| JP | 7-256260 | 10/1995 |
| JP | 8-64594 | 3/1996 |
| JP | 864594 A | 3/1996 |
| JP | 251317/1999 | 9/1999 |
| JP | 3083809 | 10/1999 |

OTHER PUBLICATIONS

"Electronic Materials" Issued in May 1996 by Association of Industrial Researches, Ohmura, et al. pp. 53–55.
"Electronic Materials" Issued in May 1996 by Tsujimura, et al. pp. 62–65.
"Electronic Materials" Issued in May 1996 by Hirakura pp. 33–35.

*Primary Examiner*—Michael S. Lebentritt
(74) *Attorney, Agent, or Firm*—Antonelli, Terry, Stout & Kraus, LLP

(57) ABSTRACT

In order to provide an anticorrosive technique for metal wirings formed by a chemical mechanical polishing (CMP) method, a process for manufacturing a semiconductor integrated circuit device according to the invention comprises the steps of: forming a metal layer of Cu (or a Cu alloy containing Cu as a main component) over the major face of a wafer and then planarizing the metal layer by a chemical mechanical polishing (CMP) method to form metal wirings; anticorroding the planarized major face of the wafer to form a hydrophobic protective film over the resurfaces of the metal wirings; immersing the anticorroded major face of the wafer or keeping the same in a wet state so that it may not become dry; and post-cleaning the major face, kept in the wet state, of the wafer.

101 Claims, 13 Drawing Sheets

U.S. PATENT DOCUMENTS

| | | |
|---|---|---|
| 5,527,423 A | 6/1996 | Neville et al. |
| 5,549,798 A | 8/1996 | Kitajima et al. |
| 5,573,633 A | 11/1996 | Gambino et al. |
| 5,575,837 A | 11/1996 | Kodama et al. |
| 5,833,831 A | 11/1998 | Kitajima et al. |
| 5,854,140 A | 12/1998 | Jaso et al. |
| 5,931,723 A | 8/1999 | Katsuoka et al. |
| 6,013,578 A | 1/2000 | Jun |
| 6,028,360 A | 2/2000 | Nakamura et al. |
| 6,068,879 A | 5/2000 | Pasch |
| 6,082,373 A | 7/2000 | Sakuri et al. |
| 6,117,775 A | 9/2000 | Kondo et al. |
| 6,117,784 A | 9/2000 | Uzoh |
| 6,140,230 A | 10/2000 | Avanzino et al. |
| 6,146,135 A | 11/2000 | Watanabe et al. |
| 6,153,043 A | 11/2000 | Edelstein et al. |
| 6,376,345 B1 * | 4/2002 | Ohashi et al. ............... 438/542 |

* cited by examiner

PROCESS FOR MANUFACTURING SEMICONDUCTOR INTEGRATED CIRCUIT DEVICE

This application is a Continuation application of Ser. No. 09/356,707, filed Jul. 20, 1999, now U.S. Pat. No. 6,376,345.

BACKGROUND OF THE INVENTION

The present invention relates to a technique for manufacturing a semiconductor integrated circuit device and, more particularly, to a technique which is effective in achieving anticorrosion of metal wirings formed by a chemical mechanical polishing (CMP) method.

Japanese Patent Laid-open No. 135192/1995 (hereinafter referred to as "Hayakawa") has disclosed a post-polishing method which makes it possible to lower the particle level after polishing treatment on a wafer by performing, without drying the wafer, a series of steps including chemical mechanical polishing, followed by wafer inverting standby, physical cleaning, chemical-cleaning (or spin-cleaning) and rinsing treatments. In the polishing apparatus to be used in this process, a wafer mounting portion in the polishing unit is made to have a construction which is capable of keeping the wafer wet, and an inter-unit wet conveying mechanism is used for conveying wafers among a polishing unit, a cleaning unit and a rinsing/drying unit, whereas an in-unit wet conveying mechanism is used for conveying wafers between the individual cleaning chambers in the cleaning unit.

A CMP apparatus for an oxide film comprising a wafer feeding portion, a polishing portion, a wafer extracting portion and a dress unit is disclosed on pp. 53 to 55 of Electronic Materials, issued in May, 1996, by the Association of Industrial Researches (hereinafter referred to as "Ohmura et al."). In this apparatus, the wafer is conveyed by a conveyor robot from a load cassette to a polishing portion and is polished. The polished wafer is then scrub-cleaned on its front and back sides with pure water, is stocked in an unload cassette, and thereafter, is stocked in water.

On pp. 62 to 65 of Electronic Materials, issued in May, 1996 (hereinafter referred to as "Tsujimura et al."), there is disclosed a technique for the transfer of a wafer in an underwater stock from a polishing step to a post-cleaning treatment (aiming at removing undesired particles such as abrasive grains introduced at the polishing time from the wafer surface and generally conducted before the wafer surface is naturally dried).

On pp. 33 to 35 of Electronic Materials, issued in May, 1996 (hereinafter referred to as "Hirakura"), there is disclosed a CMP apparatus comprising a polishing disc (or platen) for performing a primary polishing treatment, a polishing disc for performing a second polishing (or buff polishing) treatment, a cleaning station for cleaning the polished wafer with water and a brush, and an unloader for stocking the wafer in a submerged state.

Japanese Patent Laid-open No. 64594/1996 (hereinafter referred to as "Shibuki") has disclosed a metal CMP process using a slurry containing an anticorrosive agent, such as BTA, so as to prevent corrosion of the metal, which might otherwise occur in the metal CMP process.

SUMMARY OF THE INVENTION

Hitherto, the metal wirings of an LSI have been formed by a process of depositing a metal film, such as an aluminum (Al) alloy film or a tungsten (W) film, over a silicon substrate (or wafer) using a sputtering method and then patterning the metal film by a dry etching method using a photoresist film as a mask.

As the integration of an LSI has become higher in recent years, however, the aforementioned process has become more critical with respect to the wiring resistance due to the finer thickness of the wiring width required by the high integration, producing a higher factor to deteriorate the performance of a logic LSI which requires an especially high performance. Therefore, recently attention has been given to wirings using copper (Cu), which has an electric resistance of about one half of that of Al alloy and an electromigration resistance higher by about one figure than that of Al alloy.

However, Cu is so low in the vapor pressure of its halide as to make it difficult to form the wirings using the dry etching treatment of the related art. Because of this difficulty, there has been introduced a wiring forming process (the so-called damascene process) by which grooves are formed in advance in the insulating film over the silicon substrate, and the Cu film is deposited over the insulating film including the insides of the grooves and any unnecessary Cu film outside the grooves is then polished back by chemical mechanical polishing (CMP) while leaving the Cu film in the grooves.

When the Cu film is polished by the CMP method, however, a portion of the Cu may be eluted by the action of an oxidizing agent added to the polishing slurry, so that a portion of the Cu wirings is corroded, thereby bringing about open defects or short-circuit defects.

This corrosion of the cu wirings characteristically occurs in the Cu wirings which are connected with the p-type diffusion layer of a pn junction (e.g., a diffusion resistance element, the source and drain of an MOS transistor, or the collector, base and emitter of a bipolar transistor) formed in the silicon substrate. Further, when the metal wirings are formed by polishing another metal material (e.g., W or an Al alloy) by the CMP method or when metal materials (or plugs) are buried in through holes for connecting upper and lower wirings, although not so serious as in the case of Cu wirings, corrosion may be caused for the aforementioned reasons if those metal wirings or plugs are connected with the pn junction.

FIG. 14($a$) is a model diagram illustrating an electromotive force generating mechanism of the pn junction; FIG. 14($b$) is a graph illustrating the I–V characteristics of the pn junction at a light irradiation time and at a dark time; and FIG. 15 is a model diagram illustrating a corrosion occurring mechanism of the Cu wirings.

When light comes into the pn junction formed in the silicon substrate, as shown in FIG. 14($a$), an external voltage (up to 0.6 V) at + on the p-side and at − on the n-side is generated by the photovoltaic effect of silicon, so that the I–V characteristics of the pn junction are shifted, as illustrated in FIG. 14($b$). As a result, a short-circuit current flows, as illustrated in FIG. 15, through a closed circuit which is formed of a Cu wiring connected with the p-side (or + side) of the pn junction—the pn junction—the Cu wiring connected with the n-side (or − side) of the pn junction—the polishing slurry which has stuck to the wafer surface, so that the $Cu^{2+}$ ions are dissociated from the surface of the Cu wiring connected with the p-side (or + side) of the pn junction, thereby to cause electrochemical corrosion (or electrolytic corrosion).

FIG. 16 is a graph showing relations, which occur at a time a voltage is applied, between a slurry concentration (%)

and a Cu etching (eluting) rate. For a slurry concentration of 100%, as seen from FIG. 16, the eluting rate of Cu is relatively low, but abruptly rises when the polishing slurry is diluted to some extent with water. It can be said from the foregoing discussion that, when light comes in a pn junction in a case where some of the polishing slurry or its aqueous solution has stuck to the surface of the silicon wafer, the elution of Cu grows prominent to cause electrolytic corrosion. Concretely, when light comes in the surface of the wafer either in the course of conveyance from the polishing step to the post-cleaning step or at a standby time, electrolytic corrosion occurs in the Cu wirings connected with the p-type diffusion layer of the pn junction.

An object of the present invention is to provide a technique which is capable of preventing the corrosion of metal wirings formed by using the CMP method.

This and other objects and various novel features of the invention will become apparent from the following description when taken in conjunction with the accompanying drawings.

A representative aspect of the invention to be disclosed herein will be briefly described in the following.

A process for manufacturing a semiconductor integrated circuit device according to the invention comprises the steps of: forming metal wirings by forming a metal layer (or conductive layer) over the major face of a wafer and then by planarizing the metal layer by a chemical mechanical polishing (CMP) method. The so-called "CMP technique" for planarizing the metal layer includes one technique using a standard polishing pad and floating abrasive grains, one technique using stationary abrasive grains, an intermediate technique and the so-called "abrasion grain free CMP" technique using a slurry containing substantially no abrasive grains. Further, the planarizing treatment includes not only a wiring burying technique, such as used in the damascene or dual damascene processes, but also the metal CMP technique for burying metal plugs. The method further includes the steps of forming a hydrophobic protective film over the surface of the metal wirings by pre-cleaning the planarized major face of the wafer just after the polishing treatment with a view to clearing the wafer surface of an undesired chemical, such as the oxidizing agent at the polishing time, and by anticorroding the pre- cleaned major face. The anticorroding treatment may be the cleaning step itself or its sub-step having a main object to form a hydrophobic protective film over the surface of the metal. Just after this, the anticorroding treatment is performed simultaneously with the cleaning treatment. The "just after" indicator means "before the wafer surface is dried after the polishing treatment" or "before the metal is corroded with a residual oxidizing agent". By this anticorroding treatment, it is possible to prevent the electrochemical corrosion of the metal wirings to a considerable extent. The term "electrochemical corrosion" refers to the corrosion of the metal accompanied by the battery action of the formed closed circuit which includes the metal, the pn junction, the metal and the polishing liquid component on the pattern of the wafer. The method further comprises the steps of immersing the anticorroded major face of the wafer or keeping it in a wet state so that it may not become dry. The term "wet stock" generally means "keeping or transfer" while preventing a dry state by immersing the wafer in pure water or the like, by feeding a pure water shower or by keeping the wafer in a saturated vapor atmosphere. The method then provides the step of post-cleaning the major face of the wafer which has been kept in the wet state. The "post-cleaning" treatment is generally performed before the surface becomes dry, with a view to clearing the wafer surface of undesired particles, such as abrasive grains introduced at the polishing time. This cleaning treatment frequently involves both a mechanical cleaning treatment, such as a scrub cleaning treatment using a brush, and a weak etching treatment with a chemical solution.

A summary of the features of the invention will be briefly described as follows.

1. A process for manufacturing a semiconductor integrated circuit device, comprising the steps of:
   (a) forming a metal layer whose main component is a metal, over a first major face of a wafer having a pattern of a semiconductor integrated circuit;
   (b) planarizing the first major face, having the formed metal layer, of the wafer by a chemical mechanical polishing method;
   (c) anticorroding the planarized first major face of the wafer;
   (d) immersing the anticorroded first major face of the wafer in a liquid or keeping the same in a wet state so that it may not become dry; and
   (e) post-cleaning the first major face, kept in the wet state, of the wafer.

2. A process for manufacturing a semiconductor integrated circuit device according to Item 1, wherein the anticorroding step (c) includes the steps of: mechanically cleaning a polishing slurry which has stuck to the first major face at the step (b); and forming a protective film over the surface portion of the metal layer of the first major face, from which the polishing slurry has been removed, of the wafer.

3. A process for manufacturing a semiconductor integrated circuit device according to Item 2, wherein the protective film is a hydrophobic protective film.

4. A process for manufacturing a semiconductor integrated circuit device according to any one of Items 1 to 3, wherein the post-cleaning step (e) includes the step of mechanically cleaning the foreign particles which have stuck to the first major face of the wafer at the step (b).

5. A process for manufacturing a semiconductor integrated circuit device, comprising the steps of:
   (a) forming a metal layer whose main component is copper, over a first major face of a wafer having a pattern of a semiconductor integrated circuit;
   (b) planarizing the first major face, having the formed metal layer, of the wafer by a chemical mechanical polishing method;
   (c) anticorroding the planarized first major face of the wafer;
   (d) immersing the anticorroded first major face of the wafer in a liquid or keeping the same in a wet state so that it may not become dry; and
   (e) post-cleaning the first major face, kept in the wet state, of the wafer.

6. A process for manufacturing a semiconductor integrated circuit device, comprising the steps of:
   (a) forming a metal layer whose main component is a metal, over a first major face of a wafer having a pattern of a semiconductor integrated circuit;
   (b) planarizing the first major face, having the formed metal layer, of the wafer by a chemical mechanical polishing method;
   (c) anticorroding the planarized first major face of the wafer; and
   (d) immersing the anticorroded first major face of the wafer in a liquid or keeping the same in a wet state at a shaded wafer stocking portion so that it may not become dry.

7. A process for manufacturing a semiconductor integrated circuit device according to Item 6, wherein the wafer stocking portion is shaded to have an illuminance of 500 luxes or less.

8. A process for manufacturing a semiconductor integrated circuit device according to Item 6, wherein the wafer stocking portion is shaded to have an illuminance of 300 luxes or less.

9. A process for manufacturing a semiconductor integrated circuit device, comprising the steps of:
    (a) forming a metal layer whose main component is a metal, over a first major face of a wafer having a pattern of a semiconductor integrated circuit;
    (b) planarizing the first major face, having the formed metal layer, of the wafer by a chemical mechanical polishing method; and
    (c) drying the planarized first major face of the wafer just after the planarizing step.

10. A process for manufacturing a semiconductor integrated circuit device, comprising the steps of:
    (a) forming a metal layer whose main component is a metal, over a first major face of a wafer having a pattern of a semiconductor integrated circuit;
    (b) planarizing the first major face, having the formed metal layer, of the wafer by a chemical mechanical polishing method; and
    (c) post-cleaning the planarized first major face of the wafer at a shaded post-cleaning portion.

11. A process for manufacturing a semiconductor integrated circuit device according to Item 10, wherein the post-cleaning step (c) includes the step of removing a foreign particle by applying a mechanical friction to the first major face of the wafer in the presence of an alkaline or weakly alkaline chemical.

12. A process for manufacturing a semiconductor integrated circuit device, comprising the steps of:
    (a) forming a metal layer whose main component is a metal, over a first major face of a wafer having a pattern of a semiconductor integrated circuit;
    (b) planarizing the first major face, having the formed metal layer, of the wafer by a chemical mechanical polishing method;
    (c) anticorroding the planarized first major face of the wafer; and
    (d) post-cleaning the anticorroded first major face of the wafer.

13. A process for manufacturing a semiconductor integrated circuit device, comprising the steps of:
    (a) forming a metal layer whose main component is copper, over a first major face of a wafer having a pattern of a semiconductor integrated circuit;
    (b) planarizing the first major face, having the formed metal layer, of the wafer by a chemical mechanical polishing method; and
    (c) forming a hydrophobic protective film over the planarized surface of the metal layer by anticorroding the planarized first major face of the wafer.

14. A process for manufacturing a semiconductor integrated circuit device, comprising the steps of:
    (a) forming a metal layer whose main component is a metal, over a first major face of a wafer having a pattern of a semiconductor integrated circuit;
    (b) planarizing the first major face, having the formed metal layer, of the wafer by a chemical mechanical polishing method using a sheet treatment; and
    (c) post-cleaning the planarized first major face of the wafer at a shaded post-cleaning portion.

15. A process for manufacturing a semiconductor integrated circuit device, comprising the steps of:
    (a) forming a metal layer whose main component is a metal, over a first major face of a wafer having a pattern of a semiconductor integrated circuit;
    (b) planarizing the first major face, having the formed metal layer, of the wafer by a chemical mechanical polishing method using a sheet treatment;
    (c) anticorroding the planarized first major face of the wafer; and
    (d) post-cleaning the anticorroded first major face of the wafer.

16. A process for manufacturing a semiconductor integrated circuit device, comprising the steps of:
    (a) forming a metal layer whose main component is a metal, over a first major face of a wafer having a pattern of a semiconductor integrated circuit;
    (b) planarizing the first major face, having the formed metal layer, of the wafer by a chemical mechanical polishing method;
    (c) anticorroding the planarized first major face of the wafer; and
    (d) immersing the anticorroded first major face of the wafer in a liquid or keeping the same in a wet state at a shaded wafer stocking portion, kept at a temperature as low as not to proceed an electrochemical corrosion substantially, so that it may not become dry.

17. A process for manufacturing a semiconductor integrated circuit device, comprising the steps of:
    (a) forming a metal layer whose main component is a metal, over a first major face of a wafer having a pattern of a semiconductor integrated circuit;
    (b) planarizing the first major face, having the formed metal layer, of the wafer by a chemical mechanical polishing method; and
    (c) forming a protective film over the planarized surface of the metal layer by anticorroding the planarized first major face of the wafer.

18. A process for manufacturing a semiconductor integrated circuit device according to Item 17, the anticorroding step (c) is conducted under such a condition that an oxidizing agent having stuck to the first major face of the wafer at the step (b) does not substantially act.

19. A process for manufacturing a semiconductor integrated circuit device according to Item 17 or 18, wherein the protective film is a hydrophobic protective film.

20. A process for manufacturing a semiconductor integrated circuit device, comprising the steps of:
    (a) forming a metal layer whose main component is a metal, over a first major face of a wafer having a pattern of a semiconductor integrated circuit;
    (b) planarizing th e first major face, having th e formed metal layer, of the wafer by a chemical mechanical polishing method using a sheet treatment;
    (c) anticorroding the planarized first major face of the wafer;
    (d) immersing the anticorroded first major face of the wafer in a liquid or keeping the same in a wet state so that it may not become dry; and
    (e) post-cleaning the first major face, kept in the wet state, of the wafer.

The summary of other invention will be briefly described by itemizing it, as follows.

21. A process for manufacturing a semiconductor integrated circuit device, comprising the steps of:
   (a) forming a plurality of semiconductor elements over the major face of a semiconductor substrate;
   (b) forming a metal layer over the plurality of semiconductor elements through an insulating film;
   (c) forming a plurality of metal wirings, electrically connected with the plurality of semiconductor elements, by planarizing the metal layer by a chemical mechanical polishing method;
   (d) anticorroding the surfaces of the metal wirings;
   (e) immersing the anti corroded surfaces of the metal wirings in a liquid or keeping the same in a wet state so that they may not become dry; and
   (f) post-cleaning the surfaces, kept in the wet state, of the metal wirings.

22. A process for manufacturing a semiconductor integrated circuit device according to Item 21, wherein the anticorroding step (d) includes the steps of: removing a polishing slurry, having stuck to the surfaces of the metal wirings, by a mechanism cleaning treatment; and forming a protective film over the surfaces, from which the polishing slurry was removed, of the metal wirings.

23. A process for manufacturing a semiconductor integrated circuit device according to Item 22, wherein the protective film is a hydrophobia protective film.

24. A process for manufacturing a semiconductor integrated circuit device according to any one of Items 21 and 23, wherein the plurality of semiconductor elements have a pn junction, and the plurality of metal wirings are partially electrically connected with one of the pn junction whereas the remaining plurality of metal wirings are electrically connected with the other of the pn junction.

25. A process for manufacturing a semiconductor integrated circuit device according to any one of Items 21 to 24, wherein the metal wirings include metal plugs.

26. A process for manufacturing a semiconductor integrated circuit device according to any one of Items 21 to 25, wherein the metal wirings contain at least copper.

27. A process for manufacturing a semiconductor integrated circuit device according to any one of Items 21 to 26, wherein the anticorroded surfaces of the metal wirings are dipped in a liquid or kept in a wet state at a shaded wafer stocking portion, so that they may not become dry.

28. A process for manufacturing a semiconductor integrated circuit device according to Item 27, wherein the wafer stocking portion is shaded to have an illuminance of 500 luxes or less.

29. A process for manufacturing a semiconductor integrated circuit device according to Item 27, wherein the wafer stocking portion is shaded to have an illuminance of 300 luxes or less.

30. A process for manufacturing a semiconductor integrated circuit device according to Item 27, wherein the wafer stocking portion is shaded to have an illuminance of 100 luxes or less.

31. A process for manufacturing a semiconductor integrated circuit device, comprising the steps of:
   (a) forming a plurality of semiconductor elements over the major face of a semiconductor substrate;
   (b) forming a metal layer over the plurality of semiconductor elements through an insulating film;
   (c) forming a plurality of metal wirings, electrically connected with the plurality of semiconductor elements, by planarizing the metal layer by a chemical mechanical polishing method; and
   (d) post-cleaning the planarized surfaces of the metal wirings, after shaded, at a post-cleaning portion.

32. A process for manufacturing a semiconductor integrated circuit device according to Item 31, wherein the metal wirings contain at least copper.

33. A process for manufacturing a semiconductor integrated circuit device comprising the steps of:
   (a) forming a plurality of semiconductor elements over the major face of a semiconductor substrate;
   (b) forming a metal layer over the plurality of semiconductor elements through an insulating film;
   (c) forming a plurality of metal wirings, electrically connected with the plurality of semiconductor elements, by planarizing the metal layer by a chemical mechanical polishing method; and
   (d) drying the planarized surfaces of the metal wirings just after the planarizing treatment.

34. A process for manufacturing a semiconductor integrated circuit device according to Item 33, wherein the metal wirings contain at least copper.

DETAILED DESCRIPTION OF THE INVENTION

Figure 1:
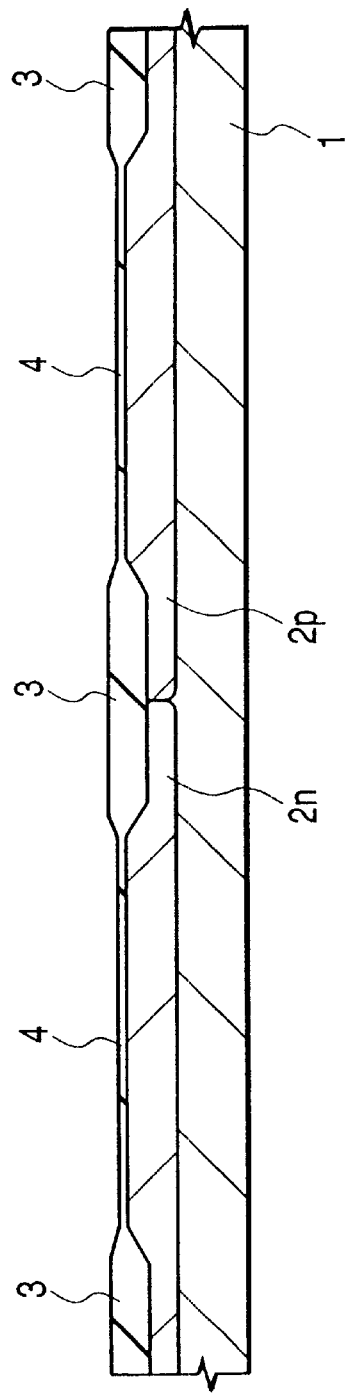
FIG. 1 is a sectional view of an essential portion of a wafer and shows a stage in the process for manufacturing an MOS-LSI according to Embodiment 1 of the invention.

The invention will be described in detail in connection with various embodiments with reference to the accompanying drawings. Here, throughout all the drawings for explaining the embodiments, members having identical functions will be designated by identical reference numerals, and their repeated description will be omitted. Further, in the following embodiments, the descriptions of the identical or similar portions will not be repeated as a rule, unless especially necessary to an understanding of the invention.

Moreover, the following embodiments will be described separately in a plurality of sections or as different modes of the embodiment, if necessary for the sake of convenience. Unless explicitly specified, however, the sections or modes of an embodiment are not to be considered as unrelated to each other, but one may be related to the other in a partial or whole modification or in a detailed or supplementary explanation. Further, when a reference is made to the number (including the number, numerical value, amount and range) of elements in the following embodiments, no limitation should be placed on the specific number, unless explicitly specified to be so or clarified in principle, but the number may be more or less than that specific number. In the following embodiments, moreover, it is needless to say that the constituent elements (including process steps) are not necessarily essential unless explicitly specified to be so or apparently essential in principle.

Likewise, in the following embodiments, the shapes or positional relationships of the constituent elements should include, when referred to, those substantially approximating or resembling the shapes unless explicitly specified or unless otherwise apparent. This will apply also to the aforementioned numerical value and range.

Further, the following terminologies as used in this specification are generally interpreted to have the following meanings with reference to the descriptions of the various features described herein.

The term "metal CMP" generally refers to a planarization of a surface made mainly of a metal, by chemical action of a polishing liquid and a mechanical polishing treatment of the surface of a wafer having a formed pattern. The metal CMP process includes the use of not only floating abrasive grains, such as in damascene or dual damascene processes, but also stationary abrasive grains, as well as the so-called "abrasive grain-free CMP" process using a slurry containing substantially no abrasive grains.

The term "just after" generally refers to "the metal CMP step before the wafer surface is naturally dried after the polishing treatment or before the metal is corroded with a residual oxidizing agent".

The term "pre-cleaning" generally refers to the cleaning treatment which is conducted just after the polishing treatment with one object to clear the wafer surface of an undesired chemical, such as the oxidizing agent, at the polishing time.

The term "corrosion preventing treatment" generally refers to the treatment for forming an hydrophobic protective film on the surface of the metal at a sub-step of the aforementioned pre-cleaning.

The term "wetting treatment" generally refers to an immersing in pure water, a feeding of a pure water shower or a holding under a drying-preventing state in the saturated atmosphere of the pure water.

The term "post-cleaning" generally refers to a cleaning treatment which is generally conducted before the surface is naturally dried, with one object being to clear the wafer surface of undesired particles, such as the abrasive grains, at the polishing time.

The term "electrochemical corrosion" generally refers to the corrosion of the metal which forms a pattern on the wafer by the battery action of the aforementioned metal and a closed circuit formed of a pn junction, the metal and an abrasive liquid component.

The term "shading" generally refers to an illuminance within such a range that the electrochemical corrosion is not intensified by light, and widely refers to a substantial darkening to an illuminance of 1,000 luxes or less in the working region of an ordinary wafer step. That is, it goes without saying that this shading includes not only a shading of light from the environment with a shading wall or the like, but also a darkening of the illumination of the place itself where the apparatus is placed. When an essential portion is to be exclusively shaded with a shading wall or a shading film, an advantage is attained in that the object can be achieved without lowering the workability in the remaining portions. In this connection, the invention can generally expect a considerable effect for an illuminance of 500 luxes or less. Considering the heterogeneity of the flow of the wafer to be treated in the mass production, however, an illuminance of 300 luxes or less is desired in the wetting treatment relating to the CMP, i.e., after the CMP treatment portion to the drying step of the post-cleaning step. Of these, further, an illuminance of 200 luxes or less is more desirable especially in corrosible, portions (for the CMP, corrosion-preventing, pre-cleaning, wetting and post-cleaning treatments). Moreover, in such a region in these CMP related wetting portions which require no considerable illuminance for the processing, a stable corrosion-preventing effect can be ensured by setting the illuminance to 150 luxes or less, more desirably to 100 luxes or less.

Further, when there is used an abrasive grain-free CMP (or widely a CMP using a slurry containing 0.5 wt. % or less of abrasive grains, as the abrasive grain concentration in the slurry is ordinarily 0.1 wt. % or less. When more stable characteristics are demanded, however, the concentration is desired to be 0.05 wt. % or less.), since the polishing treatment is conducted mainly in the metal corrosion region, it is considered that the necessity for the shading is enhanced in order to suppress the electrochemical corrosion by light.

It is also possible to use the abrasive grain-free CMP or a corrosion preventing agent in another CMP treatment. In this case, the rate of polishing the metal may become lower according to the property of the slurry. In this case, the main polishing treatment is executed as in the embodiment with the slurry containing substantially no corrosion preventing agent, and the corrosion preventing treatment is then executed at the subsidiary polishing treatment step or at the corrosion preventing or cleaning step. Then, the main polishing treatment can be executed under optimum conditions. If the remaining conditions are satisfied, however, the corrosion preventing treatment can be used together with the main polishing treatment.

The term "mechanical cleaning treatment" generally refers to cleaning which is conducted by rubbing the surface with a scrub brush or the like.

In the present specification, moreover, the term "wafer" denotes not only a single-crystalline silicon wafer, but also a silicon epitaxial wafer or one having one or a plurality of epitaxial regions formed on an insulating substrate. The "semiconductor integrated circuit device" contains not only those formed over the aforementioned various wafers, but also electric or electronic circuit devices formed over another substrate, such as a TFT liquid crystal, except for an explicitly denied case.

[Embodiment 1]

A process for manufacturing an MOS-LSI according to one embodiment of the invention will be described sequentially in steps with reference to FIGS. 1 to 11.

First of all, as shown in FIG. 1, a semiconductor substrate (wafer) 1 of p-type single crystalline silicon, for example, is prepared. An n-type well $2n$, a p-type well $2p$ and a field oxide film 3 are formed over the major face of the semiconductor substrate 1 by the well-known ion implantation and selective oxidation (LOCOS) method, and the individual surfaces of the n-type well $2n$ and the p-type well $2p$ are thermally oxidized to form a gate oxide film 4.

Figure 2:
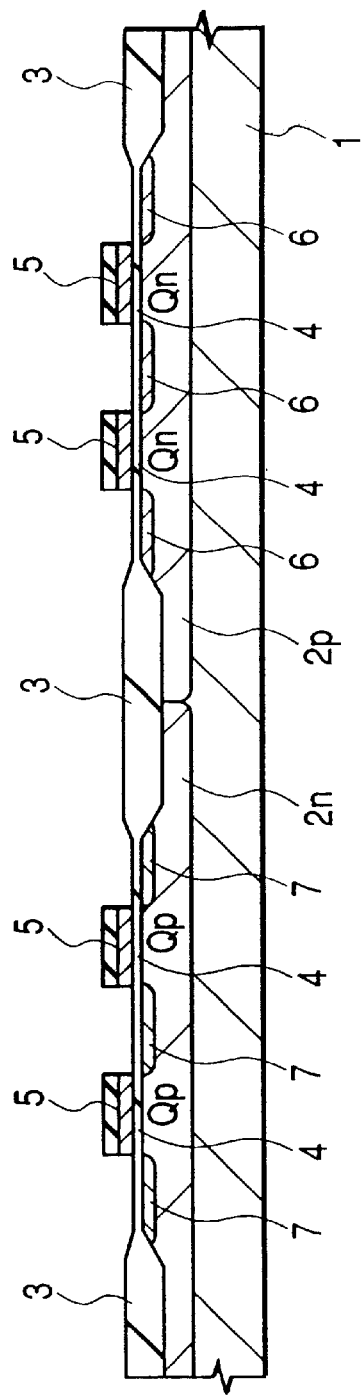
FIG. 2 is a sectional view of the essential portion of the wafer and shows a further stage in the MOS-LSI manufacturing process according to Embodiment 1 of the invention.
Figure 3:
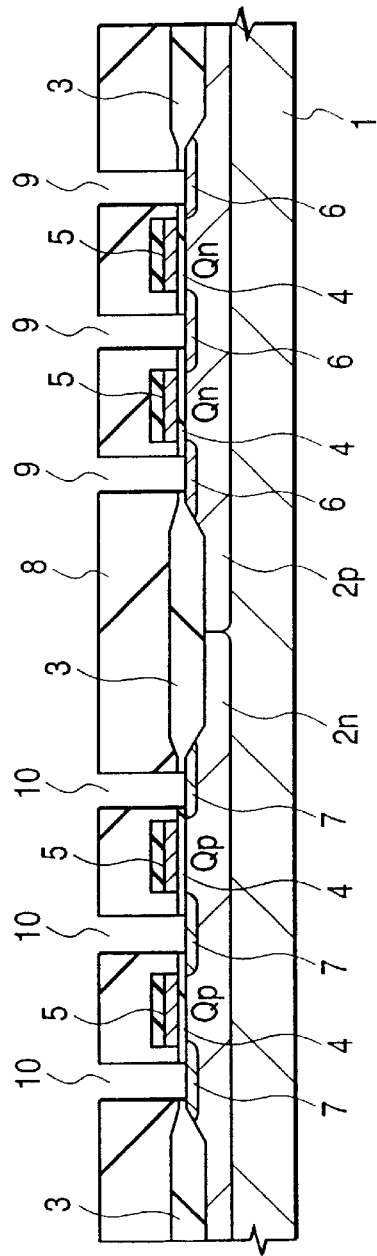
FIG. 3 is a sectional view of the essential portion of the wafer and shows a further stage in the MOS-LSI manufacturing process according to Embodiment 1 of the invention.

Next, as shown in FIG. 2, gate electrodes 5 are formed over the individual gate oxide films 4 of the n-type well $2n$ and the p-type well $2p$. After this, an n-channel MISFET (Qn) and a p-channel MISFET (Qp) are formed by doping the p-type well $2p$ with ions of an n-type-impurity (e.g., phosphor) to form a source and a drain (or n-type semiconductor regions 6) and by doping n-type well $2n$ with ions of a p-type impurity (e.g., boron) to form a source and a drain (or p-type semiconductor regions 7). Next, as shown in FIG. 3, a silicon oxide film 8 is deposited over the semiconductor substrate 1 by the CVD method and is then dry-etched by using a photoresist film as a mask to form contact holes 9 over the source and drain (or the n-type semiconductor regions 6) of the n-channel MISFET (Qn) and contact holes 10 over the source and drain (or the p-type semiconductor regions 7) of the p-channel MISFET (Qp).

Figure 4:
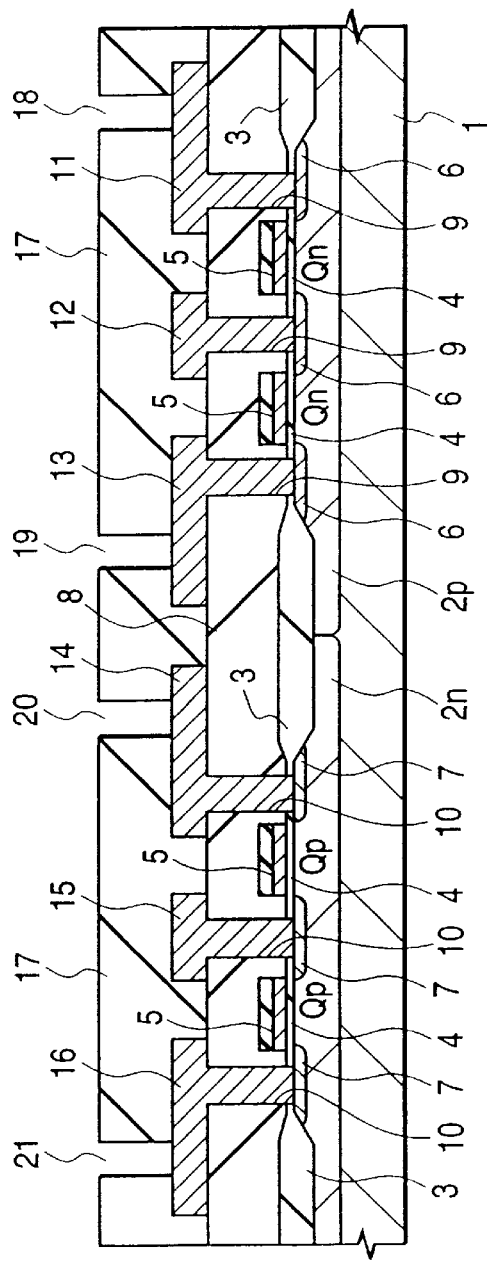
FIG. 4 is a sectional view of the essential portion of the wafer and shows a further stage in the MOS-LSI manufacturing process according to Embodiment 1 of the invention.

Next, as shown in FIG. 4, first-layer w wirings 11 to 16 are formed over the silicon oxide film 8, and a first-layer interlayer insulating film 17 is then formed by depositing a silicon oxide film over those W wirings 11 to 16 by the CVD method. After this, through holes 18 to 21 are formed in the interlayer insulating film 17 by the dry-etching method using a photoresist film as a mask. The first-layer W wirings 11 to 16 are formed, for example, by depositing a W film by the CVD method (or sputtering method) over the silicon oxide film 8 including the inside of the contact holes 9 and 10, and then by patterning the W film by the dry-etching method using a photoresist film as a mask.

Figure 5:
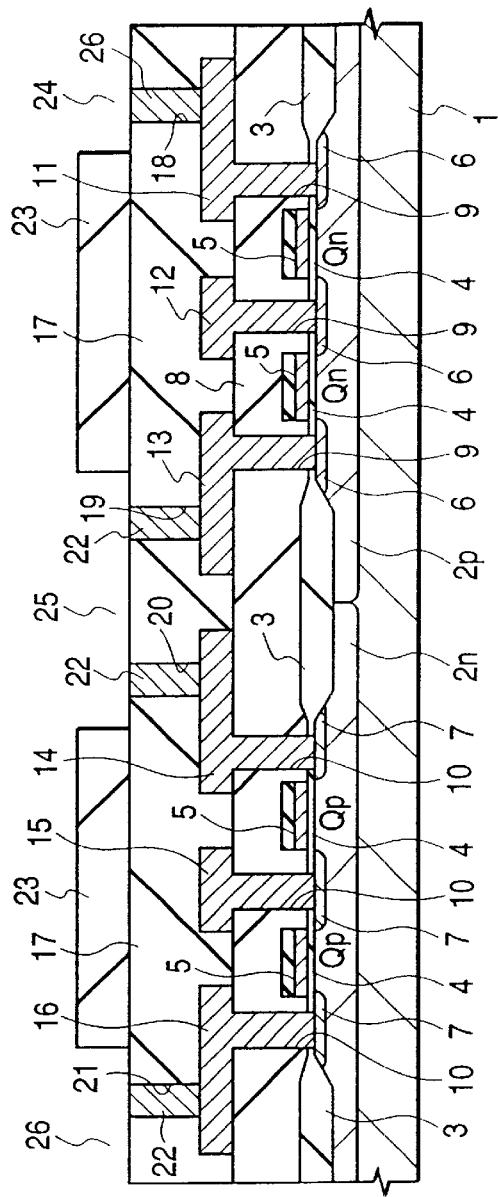
FIG. 5 is a sectional view of the essential portion of the wafer and shows a further stage in the MOS-LSI manufacturing process according to Embodiment 1 of the invention.

Next, as shown in FIG. 5, plugs 22 are formed in the through holes 18 to 21, and a silicon oxide film 23 is then deposited over the interlayer insulating film 17 by the CVD method. After this, grooves 24 to 26 are formed in the silicon oxide film 23 by the dry-etching method using a photoresist film as a mask. The plugs 22 are formed by depositing a w film by the CVD method over the interlayer insulating film 17 including the insides of the through holes 18 to 21, and by etching back (or polishing by a later-described CMP method) the W film.

Figure 6:
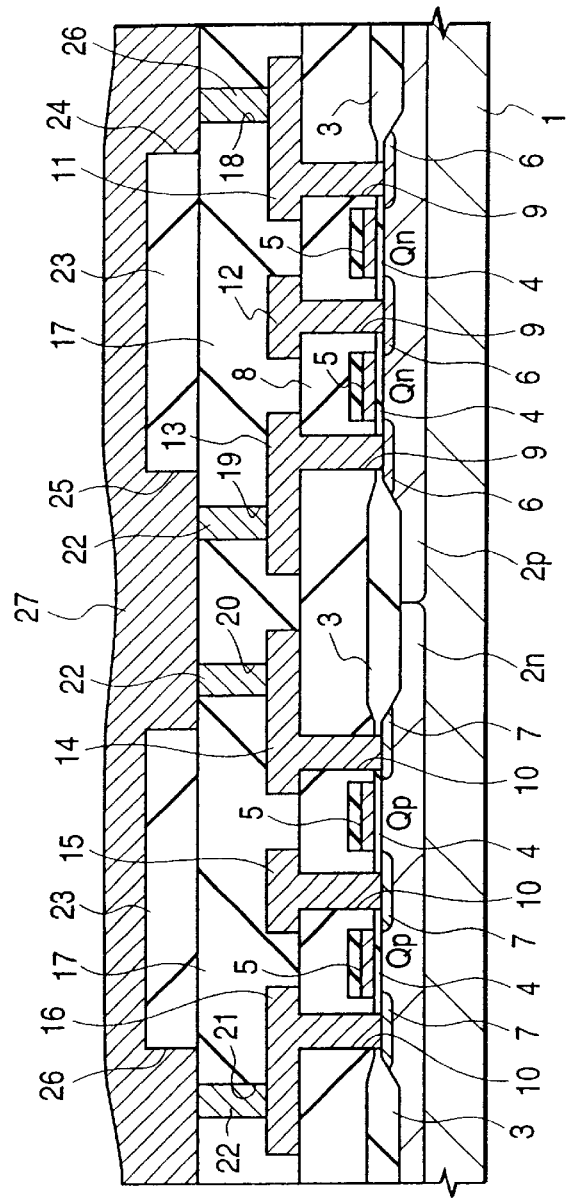
FIG. 6 is a sectional view of the essential portion of the wafer and shows a further stage in the MOS-LSI manufacturing process according to Embodiment 1 of the invention.

Next, as shown in FIG. 6, a Cu film (or a Cu alloy film containing Cu as a major component) 27 is deposited over the silicon oxide film 23 including the insides of the grooves 24 to 26 by using a low-pressure long-distance sputtering method, for example. Here, when the grooves 24 to 26 have such a large aspect ratio that the sputtering method finds it difficult to bury the Cu film 27 sufficiently therein, the semiconductor substrate 1 may be thermally treated after the deposition of the Cu film 27 to cause the Cu film 27 to reflow into the grooves 24 to 26. Alternatively, the Cu film 27 may be formed by the CVD method or electric plating method which is better in the step coverage than the sputter-reflow method.

Figure 7:
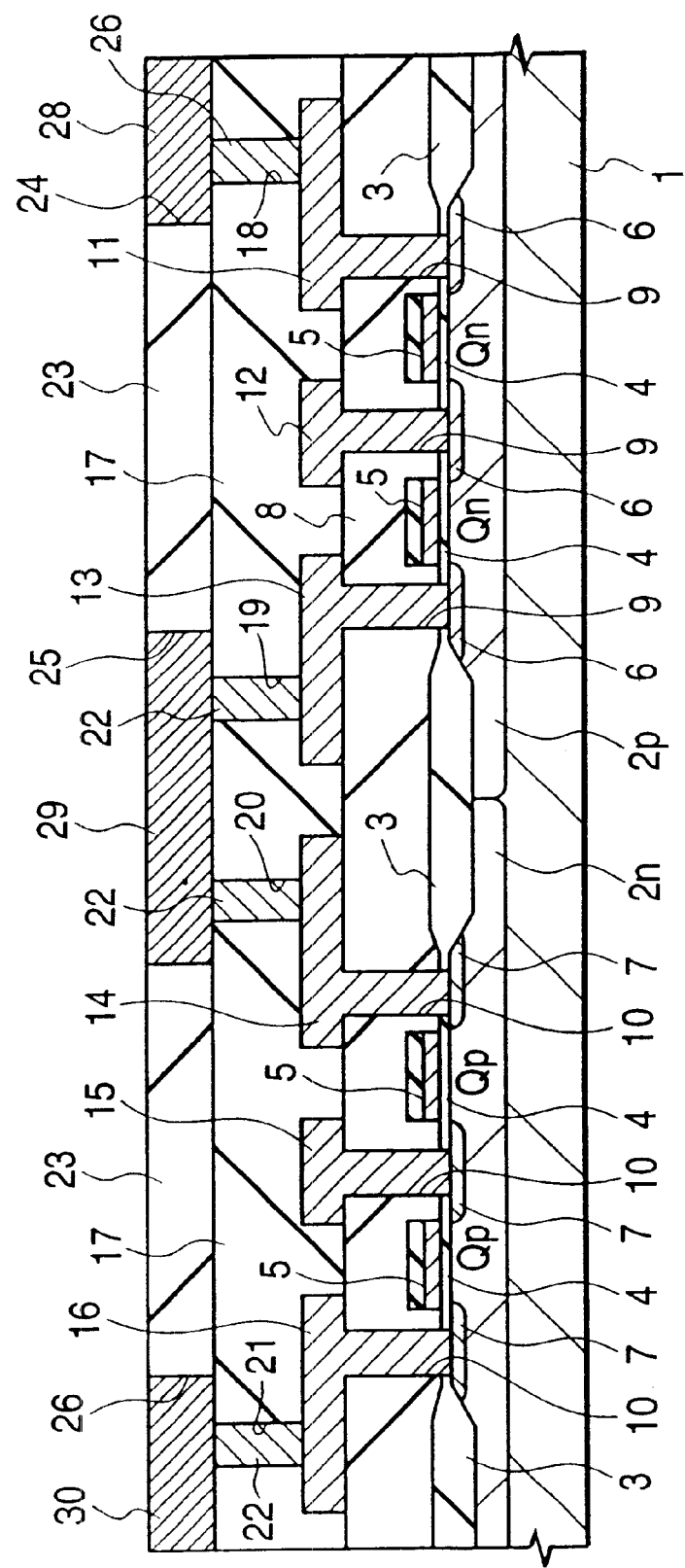
FIG. 7 is a sectional view of the essential portion of the wafer and shows a further stage in the MOS-LSI manufacturing process according to Embodiment 1 of the invention.
Figure 8:
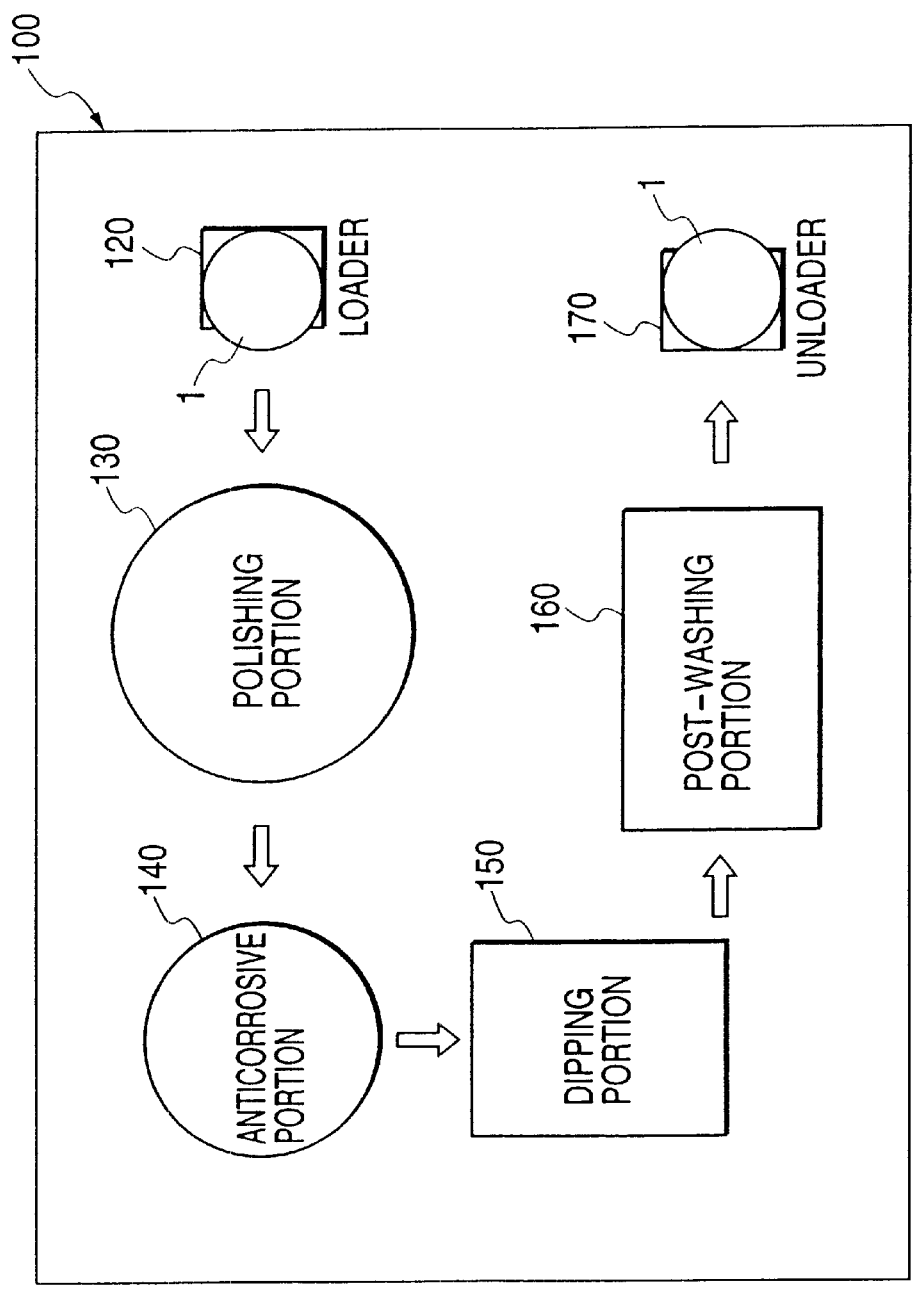
FIG. 8 is a diagram showing the overall configuration of a CMP apparatus to be used in Embodiment 1 of the invention.

Next, as shown in FIG. 7, second-layer Cu wirings 28 to 30 are formed in the grooves 24 to 26 by polishing the aforementioned Cu film 27 using the CMP method, as will be described in the following, to planarize its surface. FIG. 8 is a schematic diagram showing a sheet type CMP apparatus 100 to be used for polishing the Cu film 27. This CMP apparatus 100 comprises: a loader 120 for accommodating a plurality of wafers 1 each having the Cu film 27 formed on its surface; a polishing portion 130 for polishing and planarizing the Cu film 27; an anticorroding portion 140 for making the polished surface of the wafer 1 anticorrosive; an immersing portion 150 for preventing the anticorroded wafer 1 from becoming dry on its surface until it is post-cleaned; a post-cleaning portion 160 for post-cleaning the anticorroded wafer 1; and an unloader 170 for accommodating a plurality of post-cleaned wafers 1.

Figure 9:
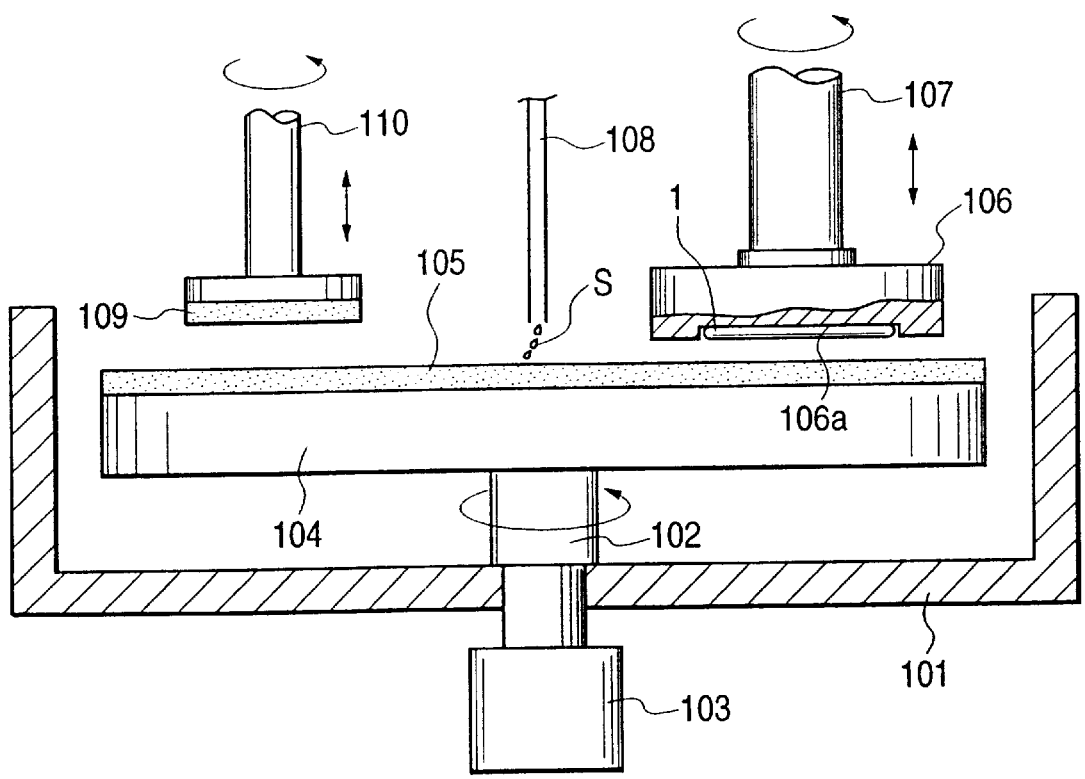
FIG. 9 is a schematic diagram showing a polishing portion of the CMP apparatus to be used in Embodiment 1 of the invention.

As shown in FIG. 9, the polishing portion 130 of the CMP apparatus 100 is equipped with a casing 101 having an opened upper portion. On the upper end portion of a rotary shaft 102 attached to the casing 101, there is mounted a polishing disc 104(or platen) to be rotationally driven by a motor 103. On the surface of this polishing disc 104, there is mounted a polishing pad 105 which is formed by homogeneously applying a synthetic resin having a number of pores.

Further, this polishing portion 130 is equipped with a wafer carrier 106 for holding the wafer 1. A drive shaft 107, to which the wafer carrier 106 is n attached, is rotationally driven together with the wafer carrier 106 by a (not-shown) motor and is moved upward and downward over the polishing disc 104.

The wafer 1 is held on the wafer carrier 106 with its major face to be polished being directed downward, by a (not-shown) vacuum sucking mechanism disposed in the wafer carrier 106. In the lower end portion of the wafer carrier 106, there is formed a recess 106a for accommodating the wafer 1. When the wafer 1 is fitted in the recess 106a, its exposed face takes a level substantially identical to or slightly protruding from the lower end face of the wafer carrier 106.

Over the polishing disc 104, there is disposed a slurry supply tube 108 for supplying a polishing slurry (S) between the surface of the polishing pad 105 and the face of the wafer 1. This face of the wafer 1 is chemically and mechanically polished with the polishing slurry (S) supplied from the lower end of the slurry supply tube 108. The polishing slurry (S) to be used is exemplified by an aqueous dispersion or solution which contains mainly abrasive grains such as alumina and an oxidizing agent such as an aqueous solution of hydrogen peroxide or ferric nitrate.

Further, this polishing portion 130 is equipped with a dresser 109 or a tool for shaping (or dressing) the surface of the polishing pad 105. This dresser 109 is attached to the lower end portion of a drive shaft 110 which is moved upward and downward over the polishing disc 104, and is rotationally driven by a (not-shown) motor.

The dressing treatment is performed after several wafers 1 have been polished (in the batch treatment) or each time the polishing treatment of one wafer 1 is carried out (in the sheet treatment). Alternatively, the dressing treatment may be effected simultaneously with the polishing treatment.

When the wafer 1 is pushed onto the polishing pad 105 by the wafer carrier 106 and polished for a predetermined time period, for example, the wafer carrier 106 is retracted upward. Next, the dresser 109 is moved downward and pushed onto the polishing pad 105 to dress the surface of the polishing pad 105 for a predetermined time period, and is then retracted upward. Subsequently, another wafer 1 is attached to the wafer carrier 106, and the aforementioned polishing treatment is repeated. After the wafer 1 is thus polished, the rotation of the polishing disc 104 is stopped to end the polishing work.

The wafer 1 thus polished is subjected on its surface to the anticorroding treatment at the anticorroding portion 140. This anticorroding portion 140 is made to have a construction similar to that of the aforementioned polishing portion 130. Here, the major face of the wafer 1 is pushed to the polishing pad attached to the surface of the polishing disc (or platen), so that the polishing slurry is mechanically removed. After this, a chemical solution containing an anticorrosive agent such as benzotriazole (BTA) is fed to the major face of the wafer 1, so that a hydrophobic protective film is formed over the surface portions of the aforementioned Cu wirings 28 to 30 formed over the major face of the wafer 1.

The aforementioned pre-cleaning treatment for mechanically removing the undesired chemical in the polishing slurry containing the oxidizing agent from the surface of the wafer 1 is preferably performed just after the end of the polishing work. That is, the pre-cleaning treatment is performed either before the surface of the polished wafer 1 is naturally dried or before the electrochemical corroding reaction of the Cu wirings 28 to 30 is substantially started by the oxidizing agent in the polishing slurry left on the surface of the wafer 1.

The mechanical cleaning (or pre-cleaning) treatment of the polishing slurry can also be performed by cleaning the surface of the wafer 1 with pure water while brushing it with a scrub brush such as a nylon brush. At the anticorroding treatment after the pre-cleaning treatment, further, the pure water scrub cleaning, pure water ultrasonic cleaning, pure water flow cleaning or pure water spin cleaning treatment may be performed prior to or together with the anticorroding treatment thereby to remove the oxidizing agent in the polishing slurry sufficiently from the major face of the wafer 1 at the polishing portion 130, so that the hydrophobic protective film is formed under a condition in which the oxidizing agent does not substantially act.

The anticorroded wafer 1 is temporarily stocked in the immersing portion 150 so that its surface may be prevented from becoming dry. The immersing portion 150 is provided for preventing the surface of the anticorroded wafer 1 from becoming dry until the wafer 1 is post-cleaned. The immersing portion 150 is made to have a structure in which a predetermined number of wafers 1 are immersed and stocked in an immersing bath (or stocker) overflowing pure water, for example. At this time, the Cu wirings 28 to 30 can be more reliably prevented from being corroded, by feeding the immersing bath with pure water which is cooled to such a low temperature as to prevent any substantial advance of the electrochemical corrosion of the Cu wirings 28 to 30.

The prevention of the wafer 1 from becoming dry may be performed by any method, such as for example a feed of pure water shower, other than the aforementioned stock in the immersing bath, if it can keep at least the surface of the wafer 1 in the wet state. Here, when the aforementioned polishing treatment and anticorroding treatment are performed by the sheet method, the aforementioned stock in the immersing bath is not necessarily indispensable if these treatments and the post-cleaning treatment proceed at the same timing, but the anticorroded wafer 1 may be instantly conveyed to the post-cleaning portion 160. Also, in this case, however, in order to prevent the wafer 1 being conveyed from becoming dry, the wafer 1 is preferably conveyed while being kept wet on its surface by a pure water immersing method or pure water shower feeding method.

The wafer 1 thus conveyed to the post-cleaning portion 160 is instantly post-cleaned while its surface is being kept wet. Here, the surface of the wafer 1 is scrub-cleaned (or brush-cleaned) while being fed with a weak alkaline chemical solution such as aqueous ammonia so as to neutralize the oxidizing agent, and the surface of the wafer 1 is then subjected to etching with an aqueous solution of hydrofluoric acid so that it is cleared of foreign grains (or particles) by the etching treatment. Prior to or together with the aforementioned scrub-cleaning treatment, the surface of the wafer 1 may be subjected to pure water scrub-cleaning, pure water ultrasonic cleaning, pure water flow-cleaning or pure water spin-cleaning treatment, and the back of the wafer 1 may be subjected to pure water scrub-cleaning treatment.

The post-cleaned wafer 1 is rinsed with pure water and spin-dried and is stocked under the dry state in the unloader 170, and a plurality of wafers are conveyed altogether as a unit to a subsequent step.

Figure 10:
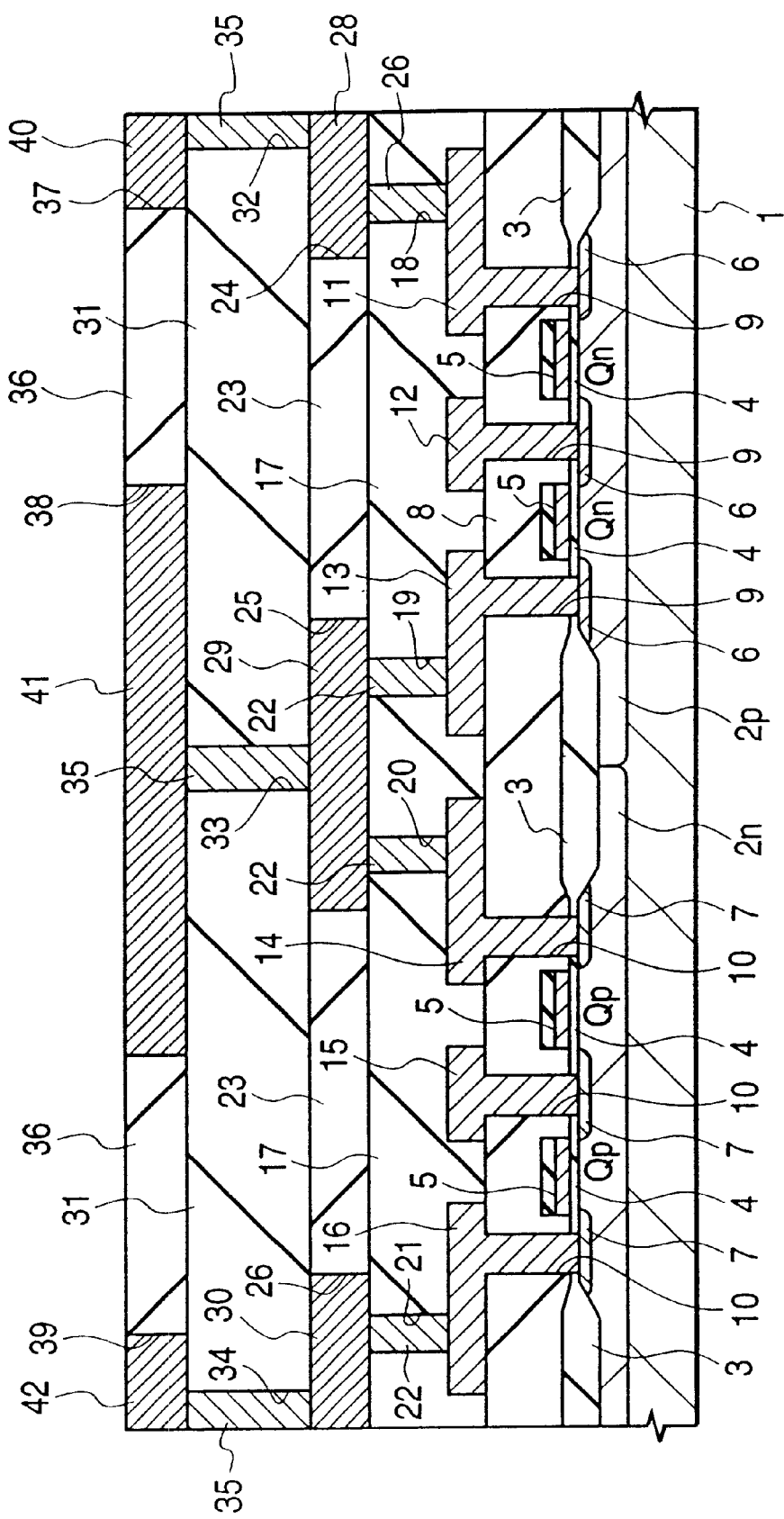
FIG. 10 is a sectional view of the essential portion of the wafer formed by the MOS-LSI manufacturing process according to Embodiment 1 of the invention.

Now, there will be a brief description of a process which is performed after the Cu wires have been formed. First of all, as shown in FIG. 10, a silicon oxide film is deposited over the Cu wirings 28 to 30 of the second layer by the CVD method to form a second-layer interlayer insulating film 31. Next, through holes 32 to 34 are formed in the interlayer insulating film 31 by a dry-etching method using a photoresist film as a mask. Plugs 35 of a W film are buried in the through holes 32 to 34. Subsequently, a silicon oxide film 36 is deposited over the interlayer insulating film 31 by the CVD method, and third-layer cu wirings 40 to 42 are formed in grooves 37 to 39 formed in the silicon oxide film 36. The plugs 35 and the third-layer Cu wirings 40 to 42 are individually formed by a method similar to that of the aforementioned plugs 22 and second-layer Cu wirings 28 to 30.

Figure 11:
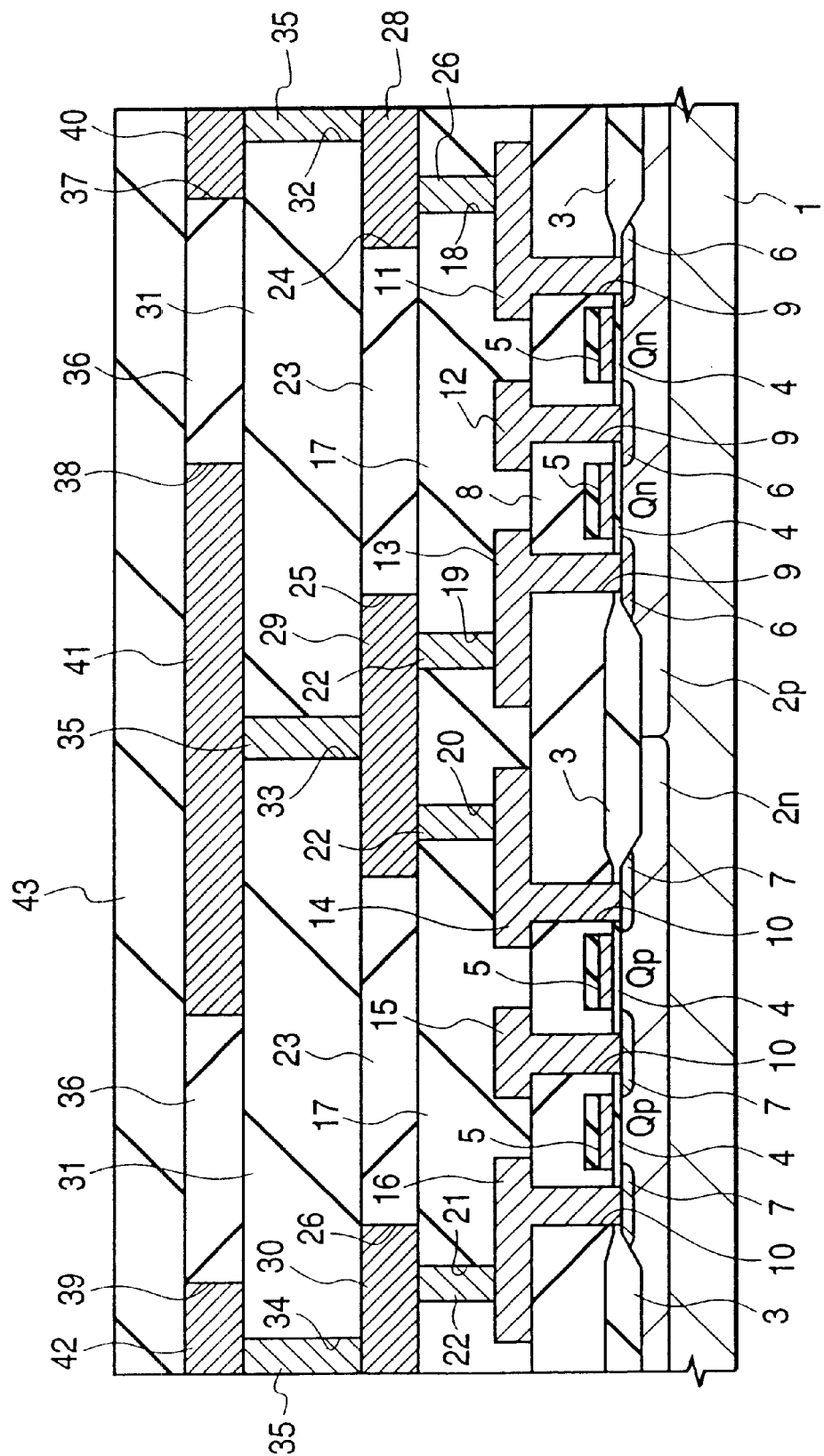
FIG. 11 is a sectional view of the essential portion of the wafer formed by the MOS-LSI manufacturing process according to Embodiment 1 of the invention.

After this, as shown in FIG. 11, a passivation film 43 is formed by depositing a silicon oxide film and a silicon nitride film over the Cu wirings 40 to 42 by the CVD method thereby to complete a CMOS-logic LSI.

[Embodiment 2]

Figure 12:
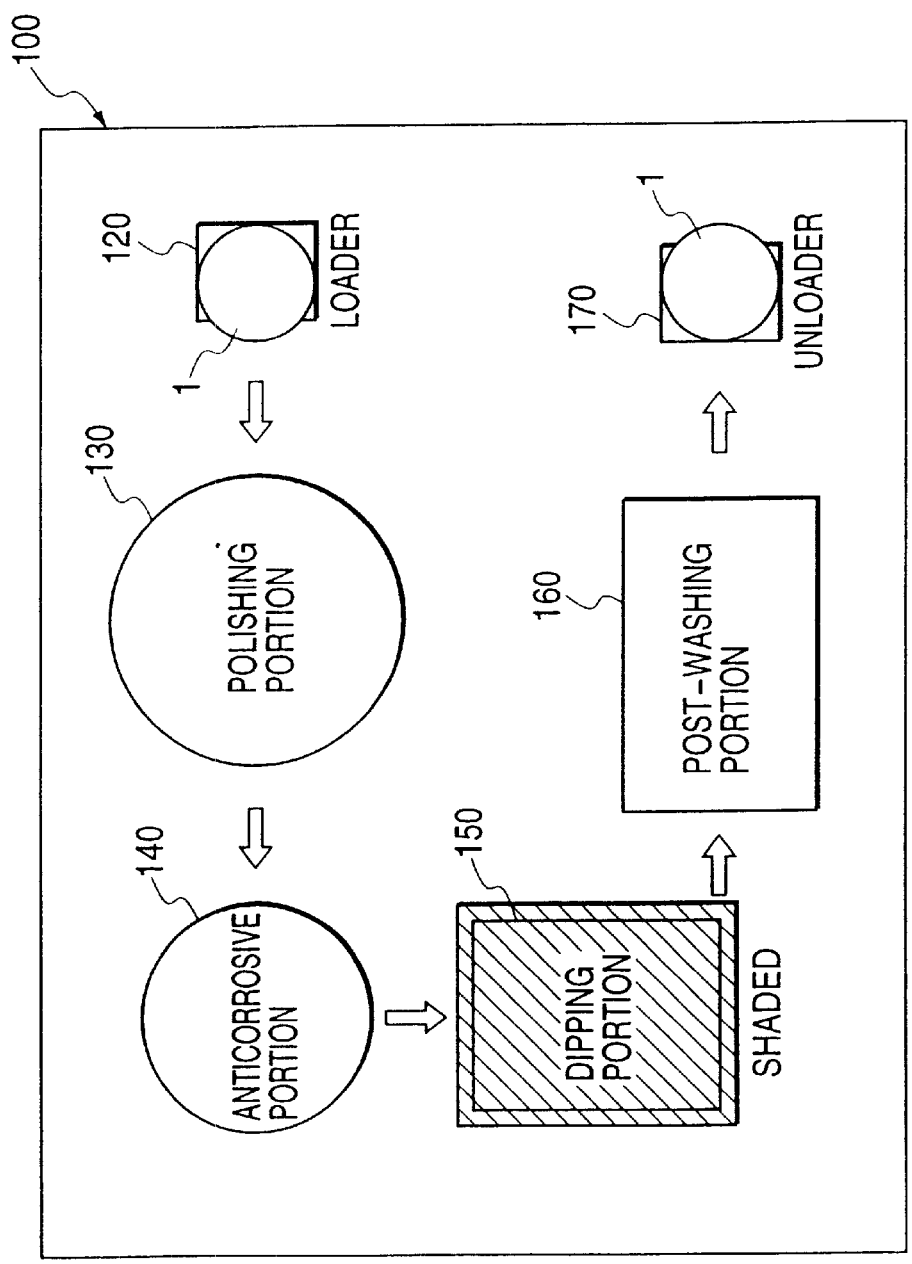
FIG. 12 is a diagram of the overall configuration of a CMP apparatus to be used in Embodiment 2 of the invention.

FIG. 12 is a schematic diagram showing the sheet type CMP apparatus 100 to be used in this embodiment for forming the CU wirings. This CMP apparatus 100 comprises: a loader 120 for accommodating a plurality of wafers 1 each having a Cu film formed on its surface; a polishing portion 130 for polishing and planarizing the Cu film to form wirings; an anticorroding portion 140 for making the polished surface of the wafer 1 anticorrosive; an immersing portion 150 for preventing the anticorroded wafer 1 from becoming dry on its surface until it is post-cleaned; a post-cleaning portion 160 for post-cleaning the anticorroded wafer 1; And an unloader 170 for accommodating a plurality of post-cleaned wafers 1. In accordance with a procedure similar to the aforementioned one of Embodiment 1, the wafer 1 is subjected to individual polishing, anticorroding, immersing and post-cleaning treatments.

Further, this CMP apparatus 100 is able to prevent a short-circuit current from being generated by a photovoltaic effect, by providing a shading structure for the immersing portion (or wafer stocking portion) 150 for preventing the surface of the anticorroded wafer 1 from becoming dry, thereby to prevent the surface of the stocked wafer 1 from being illuminated with an illuminating light. In order to provide the immersing portion 150 with a shading structure, the illuminance of the inside of the immersing bath (or stocker) is set to at most 500 luxes or less, preferably 300 luxes or less, more preferably 100 luxes or less, by coating the surrounding portion of the immersing bath (or stocker) with a shading sheet.

Further, the corrosion of the Cu wirings can be effectively prevented not only by providing the immersing portion 150 with a shading structure, but also by feeding the immersing bath with pure water which is cooled to such a low temperature that the electrochemical corrosion of the Cu wirings may not substantially proceed.

Furthermore, when the anticorroded wafer 1 is not temporarily stocked in the immersing bath, but is instantly conveyed to the post-cleaning portion 160, it is possible to provide a shading structure for the midway conveyance path from the anticorroding portion 140 to the post-cleaning portion 160 or to provide both the conveyance path and the post-cleaning portion 160 with a shading structure. Further, even when the anticorroded wafer 1 is temporarily stocked in the immersing bath, the treating portions at and downstream of the polishing portion 130, that is, all the anticorroding portion 140, the immersing portion 150 and the post-cleaning portion 160 may be provided with a shading structure.

[Embodiment 3]

Figure 13:
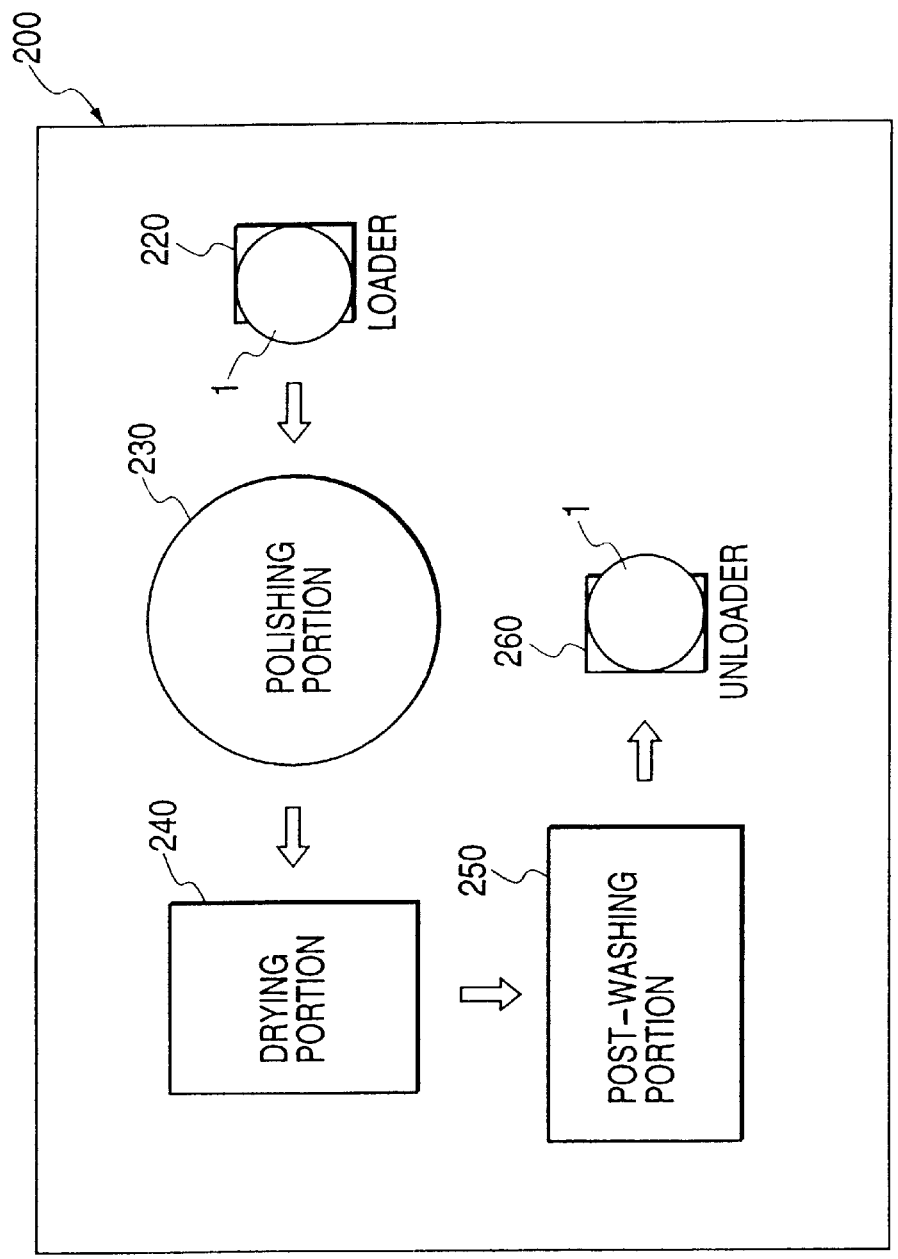
FIG. 13 is a diagram of the overall configuration of a CMP apparatus to be used in Embodiment 3 of the invention.
Figure 14A:
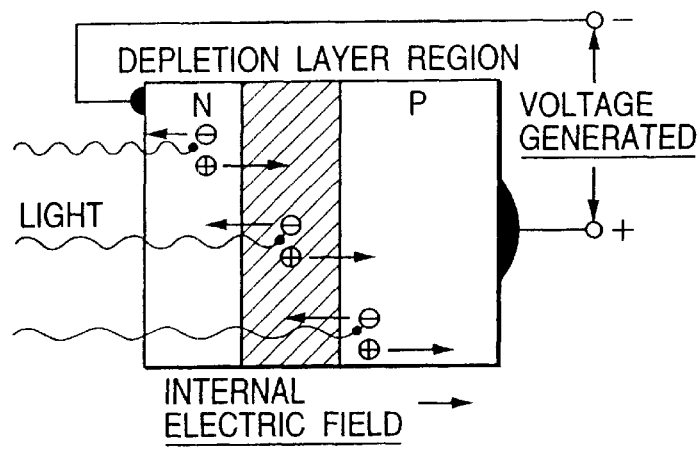
FIG. 14($a$) is a model diagram showing an electromotive force generating mechanism of a pn junction, and FIG. 14($b$) is a graph illustrating I–V characteristics of the pn junction at a light irradiation time and at a dark time.
Figure 14B:
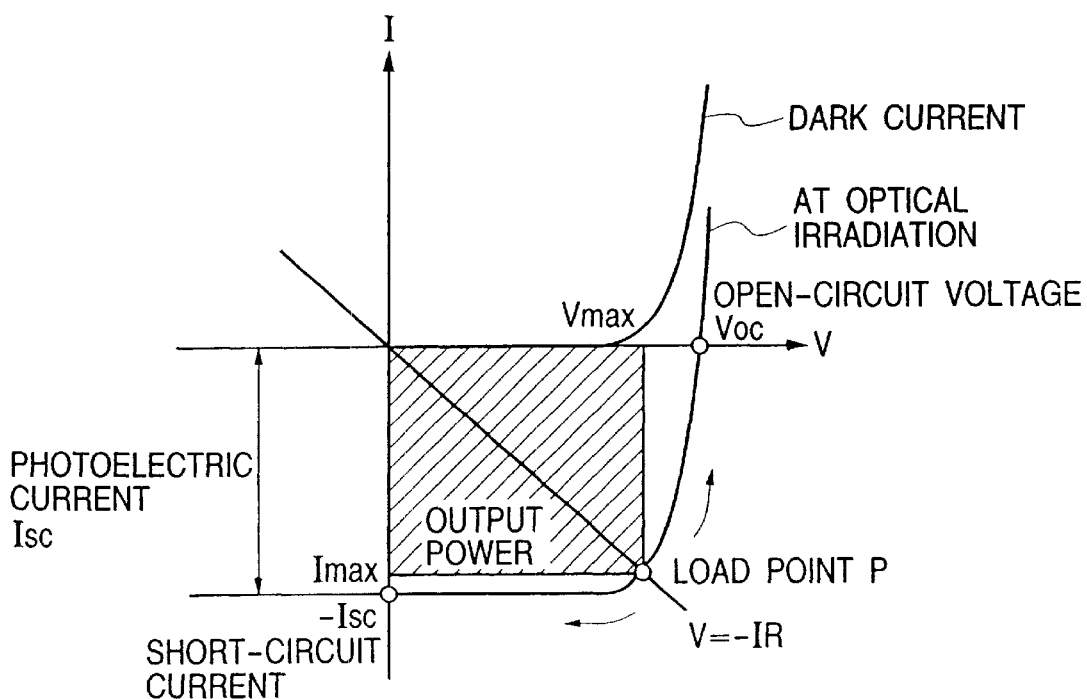
Figure 15:
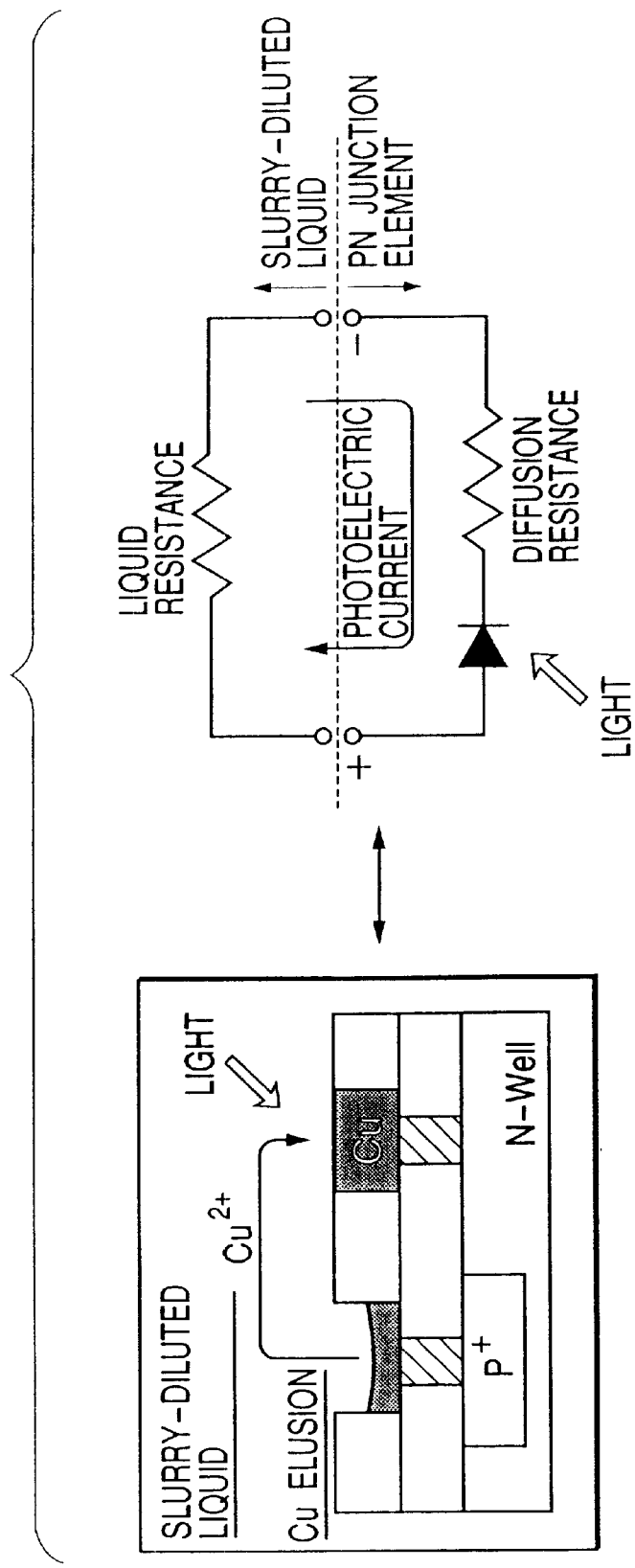
FIG. 15 is a model diagram showing a corrosion generating mechanism of a Cu wiring.
Figure 16:
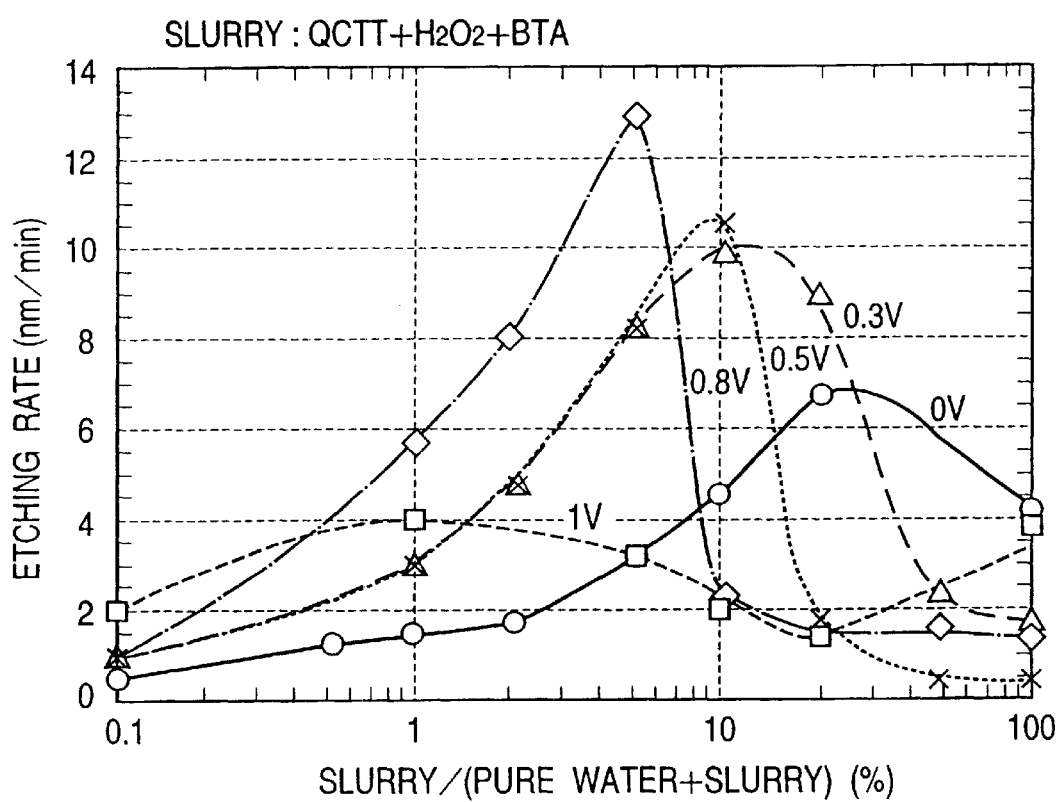
FIG. 16 is a graph showing relations, which occur at a time voltage is applied, between a slurry concentration and a Cu etching (eluting) rate.

FIG. 13 is a schematic diagram showing a sheet type CMP apparatus 200 to be used in this embodiment for forming Cu wirings. This CMP apparatus 200 comprises: a loader 220 for accommodating a plurality of wafers 1 each having a Cu film formed on its surface; a polishing portion 230 for polishing and planarizing the Cu film to form wirings; a drying portion 240 for drying the polished surface of the wafer 1; a post-cleaning portion 250 for post-cleaning the wafer 1; and an unloader 260 for accommodating a plurality of post-cleaned wafers 1.

In the Cu wiring forming process using the CMP apparatus 200, the wafer 1 which has been polished by the polishing portion 230 is conveyed to the drying portion 240 just after the polishing treatment, that is, instantly before an electrochemical corrosion with an oxidizing agent, left on the surface of the wafer 1, in the polishing slurry can be started, so that the water content in the polishing slurry is removed by a forced drying treatment. After this, the wafer 1 is conveyed, while being kept in the dry state, to the post-cleaning portion 250 in which it is post-cleaned, and is accommodated in the unloader 170 after being rinsed with pure water and spin-dried. The treatment at the polishing portion 230 and the treatment at the post-cleaning portion 250 are performed by a procedure similar to the aforementioned one of Embodiment 1.

According to this embodiment, since the surface of the wafer 1 is kept in the dry state for the time period just after the polishing treatment and before the post- cleaning treatment, the start of any electrochemical corrosion can be suppressed to prevent the corrosion of the Cu wirings effectively.

[Embodiment 4]

With reference to FIGS. 1 to 11, there will be described an abrasive grain-free CMP process using a dual damascene process. In the case of this embodiment, the plugs 22 and the copper wiring 27 of FIG. 6 are replaced by a copper wiring which is integrally made (through a conductive barrier thin film of TiN) by plating, CVD or a sputtering method. Under this state, the Abrasive grain-free CMP process is executed over the main polishing stage 130. Because of a high material selectivity of this process, the polishing substantially terminates over the substrate film after the copper has been removed. By this treatment, the copper is substantially removed from the upper face of the wafer, but is locally left by the roughness of the substrate. The wafer is transferred to the auxiliary polishing stage 140 so that it may be cleared of the residual copper film. This auxiliary polishing stage is given a structure similar to that of the aforementioned main polishing stage 130, so that it performs polishing treatment by the ordinary CMP process while supplying the slurry containing the abrasive grains. Next, at the same auxiliary stage 140, the removal of the residual barrier layer and the anticorrosion treatment are performed while suppressing the dishing of the copper wiring portion by adding a corrosion preventing agent of copper (in an amount of 0.001 wt. % or more, desirably 0.01% or more, more desirably 0.1%) such as a BTA (i.e., benzotriazole or its derivative) to the slurry containing the aforementioned abrasive grains.

After this, the wafer is stocked wet in the pure water bath 150 and is then subjected at the post-cleaning portion 160 to pure water shower cleaning, ammonia cleaning (these two cleaning treatments have a main object to remove the abrasive grains), cleaning with hydrofluoric acid (having a main object to eliminate the contamination), and spin-drying treatments until it is transferred to the unloader 170.

Here, the illuminance is held at 200 luxes or less, desirably at 100 luxes or less, from the main polishing stage 130 to the spin-drying portion 160.

Although our invention has been specifically described on the basis of various embodiments, it should not be limited thereto, but could naturally be modified in various ways without departing from the gist thereof.

Although the foregoing embodiments have been described in connection with a process using a sheet type CMP apparatus, the invention should not be limited thereto, but can also be applied to a process in which the individual polishing, corrosion preventing, immersing and post-cleaning treatments are performed by the batch method (to treat a plurality of sheets as a whole), or a sheet-batch mixed process in which those treatments are partially performed by the sheet method, whereas the remaining treatments are performed by the batch method.

Further, the foregoing embodiments have been described for the case in which the Cu wirings are formed by polishing a Cu film (or a Cu alloy film whose main component is Cu) by the CMP method. However, the invention should not be limited thereto, but can be widely applied to the so-called "dual damascene process" in which a metal layer of a Cu film, a W film or an Al alloy film is buried simultaneously in the grooves and the through holes formed in the insulating film, for example, and is then polished and planarized by the CMP method to form the wirings and the plugs simultaneously, such as the metal CMP process in which the surface side of the wafer having the formed pattern is treated by the chemical action of the polishing liquid and by mechanical polishing treatment to polish and planarize the surface of the metal or the metal layer whose main component is the metal.

Incidentally, the abrasive grain-free CMP process has been described in detail in our Japanese Patent Application 299937/1997 (bearing an application date of Sep. 12, 1997)

and its corresponding U.S. application Ser. No. 09/182438 (bearing a US application date of Oct. 30, 1998).

The effects to be obtained by a representative aspect of the invention disclosed herein will be briefly described in the following.

According to the invention, since it is possible to reliably prevent the corrosion of the metal wirings or metal plugs to be formed by the CMP method, it is possible to improve the reliability and the production yield of a high-speed LSI using the CU wirings.

What is claimed is:

1. A process for manufacturing a semiconductor integrated circuit device, comprising the steps of:
   (a) forming an insulating film over a first major surface of a wafer;
   (b) forming a wiring groove in the insulating film by patterning the insulating film;
   (c) forming a metal layer including copper as its principal component, over the insulating film and in the wiring groove;
   (d) removing the metal layer outside the wiring groove by a chemical mechanical polishing method so as to leave the metal layer in the wiring groove, wherein the wafer is treated one wafer at a time;
   (e) after step (d), transferring the wafer to a wafer storage portion, while keeping the first major surface of the wafer shaded such that an illuminance of the first major surface of the wafer is 100 lux or less;
   (f) keeping the first major surface of the wafer wet with flowing water in the wafer storage portion, while keeping the first major surface of the wafer shaded such that an illuminance of the first major surface of the wafer is 100 lux or less;
   (g) after step (f), performing scrub or brush cleaning to the first major surface of the wafer with a liquid chemical, while keeping the first major surface of the wafer shaded such that an illuminance of the first major surface of the wafer is 100 lux or less, wherein the wafer is treated one wafer at a time; and then
   (h) making the first major surface of the wafer dry, while keeping the first major surface of the wafer shaded such that an illuminance of the first major surface of the wafer is 100 lux or less.

2. A process for manufacturing a semiconductor integrated circuit device, comprising the steps of:
   (a) forming an insulating film over a first major surface of a wafer;
   (b) forming a wiring groove in the insulating film by patterning the insulating film;
   (c) forming a metal layer including copper as its principal component, over the insulating film and in the wiring groove;
   (d) removing the metal layer outside the wiring groove by a chemical mechanical polishing method so as to leave the metal layer in the wiring groove, wherein the wafer is treated one wafer at a time;
   (e) after step (d), applying an anti-corrosion treatment to the first major surface of the wafer by rubbing the first major surface of the wafer with a polishing pad provided with an anti-corrosion liquid chemical;
   (f) after step (e), transferring the wafer to a wafer storage portion, while keeping the first major surface of the wafer shaded such that an illuminance of the first major surface of the wafer is 100 lux or less;
   (g) keeping the first major surface of the wafer wet with flowing water in the wafer storage portion, while keeping the first major surface of the wafer shaded such that an illuminance of the first major surface of the wafer is 100 lux or less;
   (h) after step (g), performing scrub or brush cleaning to the first major surface of the wafer with a liquid chemical, while keeping the first major surface of the wafer shaded such that an illuminance of the first major surface of the wafer is 100 lux or less, wherein the wafer is treated one wafer at a time; and then
   (i) making the first major surface of the wafer dry, while keeping the first major surface of the wafer shaded such that an illuminance of the first major surface of the wafer is 100 lux or less.

3. A process for manufacturing a semiconductor integrated circuit device, comprising the steps of:
   (a) forming an insulating film over a first major surface of a wafer;
   (b) forming a wiring groove in the insulating film by patterning the insulating film;
   (c) forming a metal layer including copper as its principal component, over the insulating film and in the wiring groove;
   (d) removing the metal layer outside the wiring groove by a chemical mechanical polishing method so as to leave the metal layer in the wiring groove, wherein the wafer is treated one wafer at a time;
   (e) after step (d), performing pre-cleaning to the first major surface of the wafer by rubbing the first major surface of the wafer with a polishing pad provided with a liquid chemical or cleaning water;
   (f) after step (e), transferring the wafer to a wafer storage portion, while keeping the first major surface of the wafer shaded such that an illuminance of the first major surface of the wafer is 100 lux or less;
   (g) keeping the first major surface of the wafer wet with flowing water in the wafer storage portion, while keeping the first major surface of the wafer shaded such that an illuminance of the first major surface of the wafer is 100 lux or less;
   (h) after step (g), performing scrub or brush cleaning to the first major surface of the wafer with a liquid chemical, while keeping the first major surface of the wafer shaded such that an illuminance of the first major surface of the wafer is 100 lux or less, wherein the wafer is treated one wafer at a time; and then
   (i) making the first major surface of the wafer dry, while keeping the first major surface of the wafer shaded such that an illuminance of the first major surface of the wafer is 500 lux or less.

4. A process for manufacturing a semiconductor integrated circuit device, comprising the steps of:
   (a) forming an insulating film over a first major surface of a wafer having an N-type semiconductor region and a P-type semiconductor region;
   (b) forming groove or hole patterns in the insulating film;
   (c) forming a metal layer including copper as its principal component, over the first major surface of the wafer having the patterned insulating film;
   (d) forming a plurality of metal patterns by removing the metal layer outside the groove or hole patterns so as to leave the metal layer in the groove or hole patterns, wherein the wafer is treated one wafer at a time;

(e) after step (d), transferring the wafer to a wafer storage portion, while keeping the first major surface of the wafer shaded such that an illuminance of the first major surface of the wafer is 100 lux or less;

(f) keeping the first major surface of the wafer wet with flowing water in the wafer storage portion, while keeping the first major surface of the wafer shaded such that an illuminance of the first major surface of the wafer is 100 lux or less;

(g) after step (f), performing scrub or brush cleaning to the first major surface of the wafer with a liquid chemical, while keeping the first major surface of the wafer shaded such that an illuminance of the first major surface of the wafer is 100 lux or less, wherein the wafer is treated one wafer at a time; and then (h) making the first major surface of the wafer dry, while keeping the first major surface of the wafer shaded such that an illuminance of the first major surface of the wafer is 100 lux or less.

5. A process for manufacturing a semiconductor integrated circuit device, comprising the steps of:

(a) forming an insulating film over a first major surface of the wafer;

(b) forming a wiring groove in the insulating film by patterning the insulating film;

(c) forming a metal layer including copper as its principal component, over the insulating film and in the wiring groove;

(d) removing the metal layer outside the wiring groove by a chemical mechanical polishing method so as to leave the metal layer in the wiring groove, wherein the wafer is treated one wafer at a time;

(e) after step (d), immersing the first major surface of the wafer in flowing water in a water container of a water immersing portion, while keeping the first major surface of the wafer shaded such that an illuminance of the first major surface of the wafer is 100 lux or less;

(f) after step (e), performing scrub or brush cleaning to the first major surface of the wafer in a post-cleaning portion, while keeping the first major surface of the wafer shaded such that an illuminance of the first major surface of the wafer is 100 lux or less, wherein the wafer is treated one wafer at a time; and then (g) making the first major surface of the wafer dry, while keeping the first major surface of the wafer shaded such that an illuminance of the first major surface of the wafer is 100 lux or less.

6. A process for manufacturing a semiconductor integrated circuit device, comprising the steps of:

(a) forming an insulating film over a first major surface of a wafer;

(b) forming a wiring groove in the insulating film by patterning the insulating film;

(c) forming a metal layer including copper as its principal component, over the insulating film and in the wiring groove;

(d) removing the metal layer outside the wiring groove by a chemical mechanical polishing method so as to leave the metal layer in the wiring groove, wherein the wafer is treated one wafer at a time;

(e) after step (d), continuously passing the wafer to perform scrub or brush cleaning to the first major surface of the wafer with a liquid chemical, while keeping the first major surface of the wafer shaded such that an illuminance of the first major surface of the wafer is 100 lux or less, wherein the wafer is treated one wafer at a time; and then (f) making the first major surface of the wafer dry, while keeping the first major surface of the wafer shaded such that an illuminance of the first major surface of the wafer is 100 lux or less.

7. A process for manufacturing a semiconductor integrated circuit device, comprising the steps of:

(a) forming an insulating film over a first major surface of a wafer;

(b) forming a wiring groove in the insulating film by patterning the insulating film;

(c) forming a metal layer including copper as its principal component, over the insulating film and in the wiring groove;

(d) removing the metal layer outside the wiring groove by a chemical mechanical polishing method so as to leave the metal layer in the wiring groove;

(e) after step (d), transferring the wafer to a wafer storage portion, while keeping the first major surface of the wafer shaded such that an illuminance of the first major surface of the wafer is 100 lux or less;

(f) keeping the first major surface of the wafer wet with flowing water at the wafer storage portion, while keeping the first major surface of the wafer shaded such that an illuminance of the first major surface of the wafer is 100 lux or less;

(g) after step (f), performing scrub or brush cleaning to the first major surface of the wafer with a liquid chemical, while keeping the first major surface of the wafer shaded such that an illuminance of the first major surface of the wafer is 100 lux or less; and then (h) making the first major surface of the wafer dry, while keeping the first major surface of the wafer shaded such that an illuminance of the first major surface of the wafer is 100 lux or less, wherein steps (d) to (h) are performed by single wafer processing.

8. A process for manufacturing a semiconductor integrated circuit device according to claim 7, wherein the step (f) is performed prior to a substantial progress of corrosion of the metal layer left in the wiring groove.

9. A process for manufacturing a semiconductor integrated circuit device according to claim 8, wherein the metal layer left in the wiring groove in step (d) is a metal wiring of a damascene or dual damascene wiring.

10. A process for manufacturing a semiconductor integrated circuit device according to claim 9, wherein the first major surface of the wafer is kept wet from the end of step (d) to the end of step (g).

11. A process for manufacturing a semiconductor integrated circuit device according to claim 10, wherein the flowing water in step (f) is a water shower.

12. A process for manufacturing a semiconductor integrated circuit device according to claim 11, wherein an anti-corrosion treatment is applied to the metal layer between steps (d) and (f).

13. A process for manufacturing a semiconductor integrated circuit device according to claim 12, wherein the anti-corrosion treatment is performed with a liquid chemical including benzotriazole.

14. A process for manufacturing a semiconductor integrated circuit device according to claim 13, wherein the anti-corrosion treatment is performed by rubbing the first major surface of the wafer with a separate polishing pad different from a polishing pad used in step (d).

15. A process for manufacturing a semiconductor integrated circuit device according to claim 14, wherein the anti-corrosion treatment is performed simultaneously with a cleaning step by the separate polishing pad.

16. A process for manufacturing a semiconductor integrated circuit device according to claim 14, wherein the anti-corrosion treatment is performed after a cleaning step by the separate polishing pad.

17. A process for manufacturing a semiconductor integrated circuit device, comprising the steps of:
   (a) forming an insulating film over a first major surface of a wafer;
   (b) forming a wiring groove in the insulating film by patterning the insulating film;
   (c) forming a metal layer including copper as its principal component, over the insulating film and in the wiring groove;
   (d) removing the metal layer outside the wiring groove by a chemical mechanical polishing method using a first polishing pad, so as to leave the metal layer in the wiring groove;
   (e) after step (d), transferring the wafer to a wafer storage portion, while keeping the first major surface of the wafer shaded such that an illuminance of the first major surface of the wafer is 100 lux or less;
   (f) keeping the first major surface of the wafer wet with flowing water at the wafer storage portion, while keeping the first major surface of the wafer shaded such that an illuminance of the first major surface of the wafer is 100 lux or less;
   (g) after step (f), performing scrub or brush cleaning to the first major surface of the wafer with a liquid chemical, while keeping the first major surface of the wafer shaded such that an illuminance of the first major surface of the wafer is 100 lux or less; and then
   (h) making the first major surface of the wafer dry, while keeping the first major surface of the wafer shaded such that an illuminance of the first major surface of the wafer is 100 lux or less,
   wherein steps (d) to (h) are performed by single wafer processing.

18. A process for manufacturing a semiconductor integrated circuit device according to claim 17, wherein step (f) is performed prior to a substantial progress of corrosion of the metal layer left in the wiring groove.

19. A process for manufacturing a semiconductor integrated circuit device according to claim 18, wherein the metal layer left in the wiring groove in step (d) is a metal wiring of a damascene or dual damascene wiring.

20. A process for manufacturing a semiconductor integrated circuit device according to claim 19, wherein the first major surface of the wafer is kept wet from the end of step (d) to the end of step (g).

21. A process for manufacturing a semiconductor integrated circuit device according to claim 20, wherein the flowing water in step (f) is a water shower.

22. A process for manufacturing a semiconductor integrated circuit device according to claim 21, wherein the first major surface of the wafer is made dry without using lamp drying.

23. A process for manufacturing a semiconductor integrated circuit device according to claim 22, wherein an anti-corrosion treatment is performed to the metal layer between steps (d) and (f).

24. A process for manufacturing a semiconductor integrated circuit device according to claim 23, wherein the anti-corrosion treatment is performed with a liquid chemical including benzotriazole.

25. A process for manufacturing a semiconductor integrated circuit device according to claim 24, wherein the anti-corrosion treatment is performed by rubbing the first major surface of the wafer with a separate polishing pad different from a polishing pad used in step (d).

26. A process for manufacturing a semiconductor integrated circuit device according to claim 25, wherein the anti-corrosion treatment is performed simultaneously with a cleaning step by the separate polishing pad.

27. A process for manufacturing a semiconductor integrated circuit device according to claim 25, wherein the anti-corrosion treatment is performed after a cleaning step by the separate polishing pad.

28. A process for manufacturing a semiconductor integrated circuit device, comprising the steps of:
   (a) forming an insulating film over a first major surface of a wafer;
   (b) forming a wiring groove in the insulating film by patterning the insulating film;
   (c) forming a metal layer including copper as its principal component, over the insulating film and in the wiring groove;
   (d) removing the metal layer outside the wiring groove by a chemical mechanical polishing method so as to leave the metal layer in the wiring groove;
   (e) after step (d), applying an anti-corrosion treatment to the first major surface of the wafer by rubbing the first major surface of the wafer with a polishing pad provided with an anti-corrosion liquid chemical;
   (f) after step (e), transferring the wafer to a wafer storage portion, while keeping the first major surface of the wafer shaded such that an illuminance of the first major surface of the wafer is 100 lux or less;
   (g) keeping the first major surface of the wafer wet with flowing water at the wafer storage portion, while keeping the first major surface of the wafer shaded such that an illuminance of the first major surface of the wafer is 100 lux or less;
   (h) after step (g), performing scrub or brush cleaning to the first major surface of the wafer with a liquid chemical, while keeping the first major surface of the wafer shaded such that an illuminance of the first major surface of the wafer is 100 lux or less; and then
   (i) making the first major surface of the wafer dry, while keeping the first major surface of the wafer shaded such that an illuminance of the first major surface of the wafer is 100 lux or less,
   wherein steps (d) to (i) are performed by single wafer processing.

29. A process for manufacturing a semiconductor integrated circuit device according to claim 28, wherein step (e) is performed prior to a substantial progress of corrosion of the metal layer left in the wiring groove.

30. A process for manufacturing a semiconductor integrated circuit device according to claim 29, wherein the metal layer left in the wiring groove in step (d) is a metal wiring of a damascene or dual damascene wiring.

31. A process for manufacturing a semiconductor integrated circuit device according to claim 30, wherein the first major surface of the wafer is kept wet from the end of step (d) to the end of step (h).

32. A process for manufacturing a semiconductor integrated circuit device according to claim 31, wherein the flowing water in step (g) is a water shower.

33. A process for manufacturing a semiconductor integrated circuit device according to claim 32, wherein the anti-corrosion liquid chemical is a liquid chemical including benzotriazole.

34. A process for manufacturing a semiconductor integrated circuit device according to claim 33, wherein the polishing pad for the anti-corrosion treatment is different from a separate polishing pad used in step (d).

35. A process for manufacturing a semiconductor integrated circuit device according to claim 34, wherein the anti-corrosion treatment is performed simultaneously with a cleaning step by the polishing pad for the anti-corrosion treatment.

36. A process for manufacturing a semiconductor integrated circuit device according to claim 34, wherein the anti-corrosion treatment is performed after a cleaning step by the polishing pad for the anti-corrosion treatment.

37. A process for manufacturing a semiconductor integrated circuit device, comprising the steps of:
  (a) forming an insulating film over a first major surface of a wafer;
  (b) forming a wiring groove in the insulating film by patterning the insulating film;
  (c) forming a metal layer including copper as its principal component, over the insulating film and in the wiring groove;
  (d) removing the metal layer outside the wiring groove by a chemical mechanical polishing method so as to leave the metal layer in the wiring groove;
  (e) after step (d), performing pre-cleaning to the first major surface of the wafer by rubbing the first major surface of the wafer with a polishing pad provided with a liquid chemical or cleaning water;
  (f) after step (e), transferring the wafer to a wafer storage portion, while keeping the first major surface of the wafer shaded such that an illuminance of the first major surface of the wafer is 100 lux or less;
  (g) keeping the first major surface of the wafer wet with flowing water at the wafer storage portion, while keeping the first major surface of the wafer shaded such that an illuminance of the first major surface of the wafer is 100 lux or less;
  (h) after step (g), performing scrub or brush cleaning to the first major surface of the wafer with a liquid chemical, while keeping the first major surface of the wafer shaded such that an illuminance of the first major surface of the wafer is 100 lux or less; and then
  (i) making the first major surface of the wafer dry, while keeping the first major surface of the wafer shaded such that an illuminance of the first major surface of the wafer is 100 lux or less,
  wherein steps (d) to (i) are performed by single wafer processing.

38. A process for manufacturing a semiconductor integrated circuit device according to claim 37, wherein step (e) is performed prior to a substantial progress of corrosion of the metal layer left in the wiring groove.

39. A process for manufacturing a semiconductor integrated circuit device according to claim 38, wherein the metal layer left in the wiring groove in step (d) is a metal wiring of a damascene or dual damascene wiring.

40. A process for manufacturing a semiconductor integrated circuit device according to claim 39, wherein the first major surface of the wafer is kept wet from the end of step (d) to the end of step (h).

41. A process for manufacturing a semiconductor integrated circuit device according to claim 40, wherein the flowing water in step (g) is a water shower.

42. A process for manufacturing a semiconductor integrated circuit device according to claim 41, wherein the pre-cleaning includes anti-corrosion treatment with a liquid chemical including benzotriazole.

43. A process for manufacturing a semiconductor integrated circuit device according to claim 42, wherein the polishing pad for the pre-cleaning is different from a separate polishing pad used in step (d).

44. A process for manufacturing a semiconductor integrated circuit device according to claim 43, wherein the anti-corrosion treatment is performed simultaneously with a cleaning step by the polishing pad for the pre-cleaning.

45. A process for manufacturing a semiconductor integrated circuit device according to claim 43, wherein the anti-corrosion treatment is performed after a cleaning step by the polishing pad for the pre-cleaning.

46. A process for manufacturing a semiconductor integrated circuit device, comprising the steps of:
  (a) forming an insulating film over a first major surface of a wafer;
  (b) forming a wiring groove in the insulating film by patterning the insulating film;
  (c) forming a metal layer including copper as its principal component, over the insulating film and in the wiring groove;
  (d) removing the metal layer outside the wiring groove by a chemical mechanical polishing method so as to leave the metal layer in the wiring groove;
  (e) after step (d), performing anti-corrosion treatment to the first major surface of the wafer by rubbing the first major surface of the wafer with a polishing pad provided with a liquid chemical including benzotriazole;
  (f) after step (e), transferring the wafer to a wafer storage portion, while keeping the first major surface of the wafer shaded such that an illuminance of the first major surface of the wafer is 100 lux or less;
  (g) keeping the first major surface of the wafer wet with flowing water, while keeping the first major surface of the wafer shaded such that an illuminance of the first major surface of the wafer is 100 lux or less;
  (h) after step (g), performing scrub or brush cleaning to the first major surface of the wafer with a liquid chemical, while keeping the first major surface of the wafer shaded such that an illuminance of the first major surface of the wafer is 100 lux or less; and then
  (i) making the first major surface of the wafer dry, while keeping the first major surface of the wafer shaded such that an illuminance of the first major Surface of the wafer is 100 lux or less,
  wherein steps (d) to (i) are performed by single wafer processing.

47. A process for manufacturing a semiconductor integrated circuit device according to claim 46, wherein step (e) is performed prior to a substantial progress of corrosion of the metal layer left in the wiring groove.

48. A process for manufacturing a semiconductor integrated circuit device according to claim 47, wherein the metal layer left in the wiring groove in step (d) is a metal wiring of a damascene or dual damascene wiring.

49. A process for manufacturing a semiconductor integrated circuit device according to claim 48, wherein the first major surface of the wafer is kept wet from the end of step (d) to the end of step (h).

50. A process for manufacturing a semiconductor integrated circuit device according to claim 49, wherein the flowing water in step (g) is a water shower.

51. A process for manufacturing a semiconductor integrated circuit device according to claim 50, wherein the polishing pad for the anti-corrosion treatment is different from a separate polishing pad used in step (d).

52. A process for manufacturing a semiconductor integrated circuit device according to claim 51, wherein the anti-corrosion treatment is performed simultaneously with cleaning by the polishing pad for the anticorrosion treatment.

53. A process for manufacturing a semiconductor integrated circuit device according to claim 51, wherein the anti-corrosion treatment is performed after cleaning by the polishing pad for the anti-corrosion treatment.

54. A process for manufacturing a semiconductor integrated circuit device, comprising the steps of:
  (a) forming an insulating film over a first major surface of a wafer having an N-type semiconductor region and a P-type semiconductor region;
  (b) forming groove or hole patterns in the insulating film;
  (c) forming a metal layer including copper as its principal component, over the first major surface of the wafer having the patterned insulating film;
  (d) forming a plurality of metal patterns by removing the metal layer outside the groove or hole patterns so as to leave the metal layer in the groove or hole patterns;
  (e) after step (d), transferring the wafer to a wafer storage portion, while keeping the first major surface of the wafer shaded such that an illuminance of the first major surface of the wafer is 100 lux or less;
  (f) keeping the first major surface of the wafer wet with flowing water at the wafer storage portion, while keeping the first major surface of the wafer shaded such that an illuminance of the first major surface of the wafer is 100 lux or less;
  (g) after step (f), performing scrub or brush cleaning to the first major surface of the wafer with a liquid chemical, while keeping the first major surface of the wafer shaded such that an illuminance of the first major surface of the wafer is 100 lux or less; and then
  (h) making the first major surface of the wafer dry, while keeping the first major surface of the wafer shaded such that an illuminance of the first major surface of the wafer is 100 lux or less,
  wherein steps (d) to (h) are performed by single wafer processing.

55. A process for manufacturing a semiconductor integrated circuit device according to claim 54, wherein the metal patterns include a metal pattern electrically connected to the P-type semiconductor region.

56. A process for manufacturing a semiconductor integrated circuit device according to claim 55, wherein the metal patterns include a metal pattern electrically connected to the N-type semiconductor region.

57. A process for manufacturing a semiconductor integrated circuit device according to claim 56, wherein step (f) is performed by providing the first major surface of the wafer with a water shower.

58. A process for manufacturing a semiconductor integrated circuit device according to claim 57, wherein step (e) is performed prior to a substantial progress of corrosion of the metal layer left in the groove or hole patterns.

59. A process for manufacturing a semiconductor integrated circuit device according to claim 58, wherein the metal layer left in the wiring groove in step (d) is a metal wiring of a damascene or dual damascene wiring.

60. A process for manufacturing a semiconductor integrated circuit device according to claim 59, wherein the first major surface of the wafer is kept wet from the end of step (d) to the end of step (f).

61. A process for manufacturing a semiconductor integrated circuit device according to claim 60, wherein an anti-corrosion treatment is applied to the metal pattern between steps (d) and (e).

62. A process for manufacturing a semiconductor integrated circuit device according to claim 61, wherein the anti-corrosion treatment is performed with a liquid chemical including benzotriazole.

63. A process for manufacturing a semiconductor integrated circuit device according to claim 62, wherein the anti-corrosion treatment is performed by rubbing the first major surface of the wafer with a separate polishing pad different from a polishing pad used in step (d).

64. A process for manufacturing a semiconductor integrated circuit device according to claim 63, wherein the anti-corrosion treatment is performed simultaneously with a cleaning step by the separate polishing pad.

65. A process for manufacturing a semiconductor integrated circuit device according to claim 63, wherein the anti-corrosion treatment is performed after a cleaning step by the separate polishing pad.

66. A process for manufacturing a semiconductor integrated circuit device, comprising the steps of:
  (a) forming an insulating film over a first major surface of a wafer;
  (b) forming a wiring groove in the insulating film by patterning the insulating film;
  (c) forming a metal layer including copper as its principal component, over the insulating film and in the wiring groove;
  (d) removing the metal layer outside the wiring groove by a chemical mechanical polishing method so as to leave the metal layer in the wiring groove;
  (e) after step (d), transferring the wafer to a post cleaning portion, while keeping the first major surface of the wafer shaded such that an illuminance of the first major surface of the wafer is 100 lux or less;
  (f) after step (e), performing scrub or brush cleaning to the first major surface of the wafer with a liquid chemical, while keeping the first major surface of the wafer shaded such that an illuminance of the first major surface of the wafer is 100 lux or less; and then
  (g) making the first major surface of the wafer dry, while keeping the first major surface of the wafer shaded such that an illuminance of the first major surface of the wafer is 100 lux or less,
  wherein steps (d) to (g) are performed by single wafer processing, and step (e) includes the substep of:
  (i) keeping the first major surface of the wafer wet with flowing water, while keeping the first major surface of the wafer shaded such that an illuminance of the first major surface of the wafer is 100 lux or less.

67. A process for manufacturing a semiconductor integrated circuit device according to claim 66, wherein the step (e) is performed prior to a substantial progress of corrosion of the metal layer left in the wiring groove.

68. A process for manufacturing a semiconductor integrated circuit device according to claim 67, wherein the metal layer left in the wiring groove in step (d) is a metal wiring of a damascene or dual damascene wiring.

69. A process for manufacturing a semiconductor integrated circuit device according to claim 68, wherein the first major surface of the wafer is kept wet from the end of step (d) to the end of step (f).

70. A process for manufacturing a semiconductor integrated circuit device according to claim 69, wherein the flowing water in substep (i) is a water shower.

71. A process for manufacturing a semiconductor integrated circuit device according to claim 70, wherein an anti-corrosion treatment is applied to the metal layer between steps (d) and (e).

72. A process for manufacturing a semiconductor integrated circuit device, comprising the steps of:
   (a) forming an insulating film over a first major surface of a wafer;
   (b) forming a wiring groove in the insulating film by patterning the insulating film;
   (c) forming a metal layer including copper as its principal component, over the insulating film and in the wiring groove;
   (d) removing the metal layer outside the wiring groove by a chemical mechanical polishing method using a first polishing pad, so as to leave the metal layer in the wiring groove;
   (e) after step (d), transferring the wafer to a post cleaning portion, while keeping the first major surface of the wafer shaded such that an illuminance of the first major surface of the wafer is 100 lux or less;
   (f) after step (e), performing scrub or brush cleaning to the first major surface of the wafer with a liquid chemical, while keeping the first major surface of the wafer shaded such that an illuminance of the first major surface of the wafer is 100 lux or less; and then
   (g) making the first major surface of the wafer dry, while keeping the first major surface of the wafer shaded such that an illuminance of the first major surface of the wafer is 100 lux or less,
   wherein steps (d) to (g) are performed by single wafer processing, and step (e) includes the substep of:
   (i) keeping the first major surface of the wafer wet with flowing water, while keeping the first major surface of the wafer shaded such that an illuminance of the first major surface of the wafer is 100 lux or less.

73. A process for manufacturing a semiconductor integrated circuit device according to claim 72, wherein step (e) is performed prior to a substantial progress of corrosion of the metal layer left in the wiring groove.

74. A process for manufacturing a semiconductor integrated circuit device according to claim 73, wherein the metal layer left in the wiring groove in step (d) is a metal wiring of a damascene or dual damascene wiring.

75. A process for manufacturing a semiconductor integrated circuit device according to claim 74, wherein the first major surface of the wafer is kept wet from the end of step (d) to the end of step (g).

76. A process for manufacturing a semiconductor integrated circuit device according to claim 75, wherein the flowing water in substep (i) is a water shower.

77. A process for manufacturing a semiconductor integrated circuit device according to claim 76, wherein the first major surface of the wafer is made dry without using lamp drying.

78. A process for manufacturing a semiconductor integrated circuit device according to claim 77, wherein an anti-corrosion treatment is performed to the metal layer between steps (d) and (e).

79. A process for manufacturing a semiconductor integrated circuit device, comprising the steps of:
   (a) forming an insulating film over a first major surface of a wafer;
   (b) forming a wiring groove in the insulating film by patterning the insulating film;
   (c) forming a metal layer including copper as its principal component, over the insulating film and in the wiring groove;
   (d) removing the metal layer outside the wiring groove by a chemical mechanical polishing method so as to leave the metal layer in the wiring groove;
   (e) after step (d), applying an anti-corrosion treatment to the first major surface of the wafer by rubbing the first major surface of the wafer with a polishing pad provided with an anti-corrosion liquid chemical;
   (f) after step (e), transferring the wafer to a post cleaning portion, while keeping the first major surface of the wafer shaded such that an illuminance of the first major surface of the wafer is 100 lux or less;
   (g) after step (f), performing scrub or brush cleaning to the first major surface of the wafer with a liquid chemical, while keeping the first major surface of the wafer shaded such that an illuminance of the first major surface of the wafer is 100 lux or less; and then
   (h) making the first major surface of the wafer dry, while keeping the first major surface of the wafer shaded such that an illuminance of the first major surface of the wafer is 100 lux or less,
   wherein steps (d) to (h) are performed by single wafer processing, and step (f) including the substep of:
   (i) keeping the first major surface of the wafer wet with flowing water, while keeping the first major surface of the wafer shaded such that an illuminance of the first major surface of the wafer is 100 lux or less.

80. A process for manufacturing a semiconductor integrated circuit device according to claim 79, wherein step (e) is performed prior to a substantial progress of corrosion of the metal layer left in the wiring groove.

81. A process for manufacturing a semiconductor integrated circuit device according to claim 80, wherein the metal layer left in the wiring groove in step (d) is a metal wiring of a damascene or dual damascene wiring.

82. A process for manufacturing a semiconductor integrated circuit device according to claim 81, wherein the first major surface of the wafer is kept wet from the end of step (d) to the end of step (g).

83. A process for manufacturing a semiconductor integrated circuit device according to claim 82, wherein the flowing water in substep (i) is a water shower.

84. A process for manufacturing a semiconductor integrated circuit device, comprising the steps of:
   (a) forming an insulating film over a first major surface of a wafer;
   (b) forming a wiring groove in the insulating film by patterning the insulating film;
   (c) forming a metal layer including copper as its principal component, over the insulating film and in the wiring groove;
   (d) removing the metal layer outside the wiring groove by a chemical mechanical polishing method so as to leave the metal layer in the wiring groove;
   (e) after step (d), performing pre-cleaning to the first major surface of the wafer by rubbing the first major surface of the wafer with a polishing pad provided with a liquid chemical or cleaning water;

(f) after step (e), transferring the wafer to a post cleaning portion, while keeping the first major surface of the wafer shaded such that an illuminance of the first major surface of the wafer is 100 lux or less;

(g) after step (f), performing scrub or brush cleaning to the first major surface of the wafer with a liquid chemical, while keeping the first major surface of the wafer shaded such that an illuminance of the first major surface of the wafer is 100 lux or less; and then (h) making the first major surface of the wafer dry, while keeping the first major surface of the wafer shaded such that an illuminance of the first major surface of the wafer is 100 lux or less, wherein steps (d) to (h) are performed by single wafer processing, and step (f) includes the substep of:

(i) keeping the first major surface of the wafer wet with flowing water, while keeping the first major surface of the wafer shaded such that an illuminance of the first major surface of the wafer is 100 lux or less.

85. A process for manufacturing a semiconductor integrated circuit device according to claim 84, wherein step (e) is performed prior to a substantial progress of corrosion of the metal layer left in the wiring groove.

86. A process for manufacturing a semiconductor integrated circuit device according to claim 85, wherein the metal layer left in the wiring groove in step (d) is a metal wiring of a damascene or dual damascene wiring.

87. A process for manufacturing a semiconductor integrated circuit device according to claim 86, wherein the first major surface of the wafer is kept wet from the end of step (d) to the end of step (g).

88. A process for manufacturing a semiconductor integrated circuit device according to claim 87, wherein the flowing water in substep (i) is a water shower.

89. A process for manufacturing a semiconductor integrated circuit device, comprising the steps of:

(a) forming an insulating film over a first major surface of a wafer;

(b) forming a wiring groove in the insulating film by patterning the insulating film;

(c) forming a metal layer including copper as its principal component, over the insulating film and in the wiring groove;

(d) removing the metal layer outside the wiring groove by a chemical mechanical polishing method so as to leave the metal layer in the wiring groove;

(e) after step (d), performing anti-corrosion treatment to the first major surface of the wafer by rubbing the first major surface of the wafer with a polishing pad provided with a liquid chemical including benzotriazole;

(f) after step (e), transferring the wafer to a post cleaning portion, while keeping the first major surface of the wafer shaded such that an illuminance of the first major surface of the wafer is 100 lux or less;

(g) after step (f), performing scrub or brush cleaning to the first major surface of the wafer with a liquid chemical, while keeping the first major surface of the wafer shaded such that an illuminance of the first major surface of the wafer is 100 lux or less; and then (h) making the first major surface of the wafer dry, while keeping the first major surface of the wafer shaded such that an illuminance of the first major surface of the wafer is 100 lux or less, wherein steps (d) to (h) are performed by single wafer processing, and step (f) includes the substep of:

(i) keeping the first major surface of the wafer wet with flowing water, while keeping the first major surface of the wafer shaded such that an illuminance of the first major surface of the wafer is 100 lux or less.

90. A process for manufacturing a semiconductor integrated circuit device according to claim 89, wherein step (e) is performed prior to a substantial progress of corrosion of the metal layer left in the wiring groove.

91. A process for manufacturing a semiconductor integrated circuit device according to claim 90, wherein the metal layer left in the wiring groove in step (d) is a metal wiring of a damascene or dual damascene wiring.

92. A process for manufacturing a semiconductor integrated circuit device according to claim 91, wherein the first major surface of the wafer is kept wet from the end of step (d) to the end of step (g).

93. A process for manufacturing a semiconductor integrated circuit device according to claim 92, wherein the flowing water in substep (i) is a water shower.

94. A process for manufacturing a semiconductor integrated circuit device, comprising the steps of:

(a) forming an insulating film over a first major surface of a wafer having an N-type semiconductor region and a P-type semiconductor region;

(b) forming groove or hole patterns in the insulating film;

(c) forming a metal layer including copper as its principal component, over the first major surface of the wafer having the patterned insulating film;

(d) forming a plurality of metal patterns by removing the metal layer outside the groove or hole patterns so as to leave the metal layer in the groove or hole patterns;

(e) after step (d), transferring the wafer to a post cleaning portion, while keeping the first major surface of the wafer shaded such that an illuminance of the first major surface of the wafer is 100 lux or less;

(f) after step (e), performing scrub or brush cleaning to the first major surface of the wafer with a liquid chemical, while keeping the first major surface of the wafer shaded such that an illuminance of the first major surface of the wafer is 100 lux or less; and then (g) making the first major surface of the wafer dry, while keeping the first major surface of the wafer shaded such that an illuminance of the first major surface of the wafer is 100 lux or less, wherein steps (d) to (g) are performed by single wafer processing, and step (e) includes the substep of:

(i) keeping the first major surface of the wafer wet with flowing water, while keeping the first major surface of the wafer shaded such that an illuminance of the first major surface of the wafer is 100 lux or less.

95. A process for manufacturing a semiconductor integrated circuit device according to claim 94, wherein the metal patterns include a metal pattern electrically connected to the P-type semiconductor region.

96. A process for manufacturing a semiconductor integrated circuit device according to claim 95, wherein the metal patterns include a metal pattern electrically connected to the N-type semiconductor region.

97. A process for manufacturing a semiconductor integrated circuit device according to claim 96, wherein step (e) is performed by providing the first major surface of the wafer with a water shower.

98. A process for manufacturing a semiconductor integrated circuit device according to claim 97, wherein step (e)

is performed prior to a substantial progress of corrosion of the metal layer left in the groove or hole patterns.

99. A process for manufacturing a semiconductor integrated circuit device according to claim 98, wherein the metal layer left in the wiring groove in step (d) is a metal wiring of a damascene or dual damascene wiring.

100. A process for manufacturing a semiconductor integrated circuit device according to claim 99, wherein the first major surface of the wafer is kept wet from the end of step (d) to the end of step (e).

101. A process for manufacturing a semiconductor integrated circuit device according to claim 100, wherein an anti-corrosion treatment is applied to the metal pattern between steps (d) and (e).

* * * * *